(12) United States Patent
Inoue et al.

(10) Patent No.: US 8,211,242 B2
(45) Date of Patent: Jul. 3, 2012

(54) SUBSTRATE PROCESSING METHOD, SUBSTRATE PROCESSING APPARATUS, AND CONTROL PROGRAM

(75) Inventors: Yuki Inoue, Kanagawa (JP); Akira Fukunaga, Tokyo (JP); Takahiro Ogawa, Tokyo (JP)

(73) Assignee: Ebara Corporation, Tokyo (JP)

( * ) Notice: Subject to any disclaimer, the term of this patent is extended or adjusted under 35 U.S.C. 154(b) by 1030 days.

(21) Appl. No.: 11/883,831

(22) PCT Filed: Jan. 30, 2006

(86) PCT No.: PCT/JP2006/001446
§ 371 (c)(1),
(2), (4) Date: Jul. 7, 2008

(87) PCT Pub. No.: WO2006/082780
PCT Pub. Date: Aug. 10, 2006

(65) Prior Publication Data
US 2008/0314870 A1 Dec. 25, 2008

(30) Foreign Application Priority Data

Feb. 7, 2005 (JP) .................................. 2005-031170
Oct. 7, 2005 (JP) .................................. 2005-295744

(51) Int. Cl.
*B08B 3/02* (2006.01)
(52) U.S. Cl. .................... 134/56 R; 134/102.2; 134/153; 134/902
(58) Field of Classification Search ................. 134/94.1, 134/102.2, 153, 157, 902, 56 R
See application file for complete search history.

(56) References Cited

U.S. PATENT DOCUMENTS

| 5,485,644 | A | 1/1996 | Shinbara et al. |
| 5,551,829 | A * | 9/1996 | Jerolimov et al. ............ 414/757 |
| 6,186,873 | B1 * | 2/2001 | Becker et al. .................... 451/54 |
| 6,247,479 | B1 * | 6/2001 | Taniyama et al. ............ 134/95.2 |
| 6,405,739 | B1 * | 6/2002 | Liu ................... 134/149 |
| 6,491,764 | B2 | 12/2002 | Mertens et al. |
| 6,612,317 | B2 * | 9/2003 | Costantini et al. .......... 134/58 R |
| 6,805,769 | B2 * | 10/2004 | Okuda et al. ............. 156/345.12 |
| 6,818,066 | B2 * | 11/2004 | Cheung .......................... 118/715 |
| 6,860,277 | B2 * | 3/2005 | Lee et al. ....................... 134/153 |

(Continued)

FOREIGN PATENT DOCUMENTS

CN 1357907 7/2002

(Continued)

OTHER PUBLICATIONS

European Patent Office 1 058 296 Dec. 2000.*

(Continued)

*Primary Examiner* — Frankie L Stinson
(74) *Attorney, Agent, or Firm* — Wenderoth, Lind & Ponack, L.L.P.

(57) ABSTRACT

A substrate processing method includes covering, in advance, the surface of a substrate with water, holding the substrate generally horizontally with the surface facing upward and rotating it in a horizontal plane, and blowing to the substrate top surface drying gas flow that is thin in area in comparison with the substrate surface, in which the water is removed from the substrate top surface by the rotation in the horizontal plane while blowing the drying gas flow, a substrate processing apparatus for implementing the above method, and a control program for use with the above method and apparatus.

22 Claims, 13 Drawing Sheets

U.S. PATENT DOCUMENTS

| | | | |
|---|---|---|---|
| 6,899,110 B2 * | 5/2005 | Yoshida et al. | 134/107 |
| 7,017,281 B2 * | 3/2006 | Izumi | 34/565 |
| 7,021,319 B2 * | 4/2006 | Verhaverbeke et al. | 134/1.3 |
| 7,029,538 B2 * | 4/2006 | Ono et al. | 134/21 |
| 7,350,315 B2 * | 4/2008 | Davis et al. | 34/92 |
| 2004/0040177 A1 | 3/2004 | Izumi | |
| 2006/0064894 A1 * | 3/2006 | Parks | 34/406 |

FOREIGN PATENT DOCUMENTS

| | | | |
|---|---|---|---|
| CN | 1947227 | | 4/2007 |
| JP | 4-87638 | | 7/1992 |
| JP | 6-151405 | | 5/1994 |
| JP | 7-321082 | | 12/1995 |
| JP | 09-017740 | * | 1/1997 |
| JP | 10-172951 | | 6/1998 |
| JP | 10-323633 | | 12/1998 |
| JP | 11-000625 | * | 1/1999 |
| JP | 11-317389 | * | 11/1999 |
| JP | 2000-262988 | * | 9/2000 |
| JP | 2001-189260 | * | 7/2001 |
| JP | 2002-050607 | * | 2/2002 |
| JP | 2002-057088 | | 2/2002 |
| JP | 2002-176026 | | 6/2002 |
| JP | 2003-264167 | | 9/2003 |
| JP | 2004-119717 | * | 4/2004 |
| WO | 2005/104200 | | 11/2005 |

OTHER PUBLICATIONS

Japanese Official Action mailed Sep. 28, 2010 in Japanese Application No. 2007-0501556 corresponding to the present U.S. application together with partial English translation thereof.

Chinese Office Action Notice issued on Aug. 8, 2008 with partial English translation.

Supplementary European Search Report issued Oct. 21, 2010 in European Patent Application No. 06 71 2589.

* cited by examiner

SUBSTRATE PROCESSING METHOD, SUBSTRATE PROCESSING APPARATUS, AND CONTROL PROGRAM

BACKGROUND OF THE INVENTION

I. Technical Field

This invention relates to a substrate processing method, a substrate processing apparatus, and a control program, and in particular to a substrate processing method and a substrate processing apparatus that do not produce watermarks on a substrate such as a semiconductor wafer after being cleaned, and a control program for automating substrate cleaning and substrate processing.

II. Description of the Related

Along with the recent trend of making semiconductor devices in finer dimensions, it is common practice to form various material films of different physical properties on the substrate. In particular in the Damascene wiring forming process in which the wiring grooves formed in the substrate are filled with metal, as extra metal is removed with the substrate polishing device (i.e. CMP:Chemical Mechanical Polishing) or wiring protection coat is formed by plating after completing Damascene wiring, films such as a metallic film, a barrier film, an insulation film, etc. of different wetting properties to water are coexistent on the substrate surface. In recent years, copper has come to be used as the wiring metal and the so-called low dielectric constant film (low-k film) has come to be used as the insulation film. Because of hydrophobic property of the low-k film, unevenness in wetting property of the substrate surface is on the increase.

The wet processes of the substrate such as CMP and plating, developing process, etching and cleaning process are always followed by cleaning, water removal, and drying. Unlike in the process of CMP or plating, in the cleaning process, the use of surface agent in order to forcibly adjust the surface wetting property is not desirable because of residual surface active agent on the substrate surface. However, when water removal and drying are made while uneven wetting property is left unchanged, water is first removed from part of low wetting property and liquid droplets remain on part of high wetting property. When the material of the latter part dissolve in the liquid droplets and dries, it finally produces water stain (watermarks). The watermarks may be problematic in reliability because they may cause leak or poor adhesion.

As the CMP or plating is mainly made by sheet-by-sheet process, it is also efficient to make the cleaning, water removal, and drying steps of the substrate in the sheet-by-sheet process (For example, refer to JP-U-H04-87638). For water removal and drying after cleaning using a sheet-by-sheet cleaning device, there are: a method of stepwise control of the substrate rotating speed in spin drying in which the substrate after cleaning is spun at high speeds to fling away water droplets, a method of spin drying in an inert gas atmosphere or under reduced pressures, and a method of producing Marangoni convection effect by supplying isopropyl alcohol (IPA) vapor or the like during drying. These methods are intended to suppress the occurrence of watermarks.

SUMMARY OF THE INVENTION

However, when the substrate is spin-dried by controlling the substrate rotating speed, if films of different wetting properties are coexistent on the substrate such as the one on which wiring is provided by the Damascene method, fine control of the rotating speed is necessary, which raises the problem of narrow process window for production. The method of spin drying in an inert gas atmosphere or under reduced pressures requires much time for adjusting the atmosphere and so is inappropriate. The method of supplying IPA vapor requires that the substrate be lifted in vertical attitude relative to the sheet-by-sheet processing device for CMP or the like. As a result, transport mechanism becomes complicated and so the structural integration is difficult. Besides, the lifting takes time and results in the problem of decrease in throughput.

Therefore, the object of this invention is to provide a substrate processing method and a substrate processing apparatus that can dry a substrate having uneven wetting properties without locally leaving water droplets on the substrate after being cleaned regardless of the substrate size, and a control program for automating the substrate cleaning and substrate processing.

(1) To achieve the above object, a substrate processing method according to the present invention comprises the steps of, as shown in FIG. 1, for example, covering in advance a surface of a substrate W with water (28); rotating the substrate W in a horizontal plane while holding the substrate W generally horizontally with the surface facing upward (10); and blowing to a top surface of the substrate W drying gas flow that is thin in area in comparison with the substrate surface (30,40); wherein the water is removed from the substrate top surface by the rotation in the horizontal plane while blowing the drying gas flow. Here, "covering a surface of a substrate" means realizing a state in which the substrate surface is not in direct contact with the atmosphere. Typically it means to cover the substrate surface with water entirely, or to leave no part of the substrate surface unwetted. In the process of covering the substrate surface with water in advance, typically, entire top surface of the substrate is covered with water. Further, "drying gas flow that is thin in area in comparison with the substrate surface" is typically a gas flow supplied through the nozzle. Also typically, on at least part of the substrate W surface, the contact angle θ relative to water is 30 degrees or more (Refer to FIG. 2).

The above constitution is adapted such that the substrate surface is covered with water in advance and the water is removed from the substrate surface by spinning in a horizontal plane while blowing the drying gas flow. Therefore, this is the substrate processing method that makes it possible to dry the substrate after cleaning without locally leaving water droplets and resultant watermarks. While the contact angle here is not less than 30 degrees, typically it is 80 degrees or less. Such a surface has the wetting property between hydrophilic and hydrophobic and is likely to develop waterstain (watermarks).

(2) In the substrate processing method as above (1) according to the present invention, the substrate top surface is made of an insulation film and at least part of the substrate top surface is made of a metallic film part. The contact angle on the substrate top surface is typically not less than 30 degrees.

The above constitution results in a substrate processing method that does not develop watermarks on a substrate of uneven wetting properties tending to be hydrophobic in the insulation film part while tending to be hydrophilic in the metallic film part.

(3) A substrate processing method according to the present invention comprises the steps of: applying smoothing process or electroless plating process to a substrate; rotating the substrate in a horizontal plane while holding the substrate generally horizontally; covering a top surface of the substrate, to which the process was applied, with water; and blowing to the substrate top surface drying gas flow that is thin in area in comparison with the substrate surface; wherein the water is removed from the substrate top surface by the rotation in the horizontal plane while blowing the drying gas flow.

The above constitution is adapted such that the substrate is subjected to smoothing process or electroless plating process, followed by covering the substrate surface with water, and removing water from the substrate surface by spinning in a horizontal plane while blowing drying gas flow. Therefore, this is the substrate processing method that makes it possible to dry the substrate after cleaning without locally leaving water droplets and resultant watermarks. The smoothing process mentioned here is typically the CMP process. Part of the substrate surface subjected to the CMP process or electroless plating process typically has contact angle relative to water of not less than 30 degrees, and so is likely to develop watermarks.

(4) The substrate processing method as above in any one of (1) to (3) according to the present invention comprises a step of blowing to a bottom surface of the substrate drying gas flow that is thin in area in comparison with the substrate surface.

The above constitution results in the substrate processing method that makes it possible to dry the bottom surface of the substrate after cleaning without leaving water droplets, thereby preventing watermarks from being produced.

(5) The substrate processing method as above in any one of (1) to (4) according to the present invention comprises a step of scrub cleaning the substrate top surface prior to the step of covering the substrate top surface with water.

The above constitution makes it possible to remove contaminants on the substrate surface before the substrate surface is covered with water, to reduce contaminants that become nuclei of water droplets formed during drying, and to reduce probability of watermarks being produced due to the contaminants on the substrate surface.

(6) In the substrate processing method as above in any one of (1) to (5) according to the present invention, the water is de-ionized water free from at least dissolved salts.

With the above constitution, as salts and organic substances present in water, factors of increasing the size of watermarks, are removed, it is possible to restrict the occurrence of watermarks.

(7) In the substrate processing method as above in any one of (1) to (6) according to the present invention, the water is carbon dioxide dissolution water in which carbon dioxide is dissolved.

The above constitution makes it possible to increase the conductivity of water, so that static electricity, even if produced in the substrate, is less likely to remain as charge. Besides, the amount of oxygen present in solution is reduced by dissolution of carbon dioxide gas. After the dissolution of carbon dioxide gas, it is possible to restrict additional dissolution of oxygen.

(8) The substrate processing method as above in any one of (1) to (7) according to the present invention comprises a step of heating the water.

The above constitution makes water evaporate easily, so that drying time is shortened.

(9) In the substrate processing method as above in any one of (1) to (8) according to the present invention, relative humidity of the drying gas is 10% or less.

The above constitution accelerates evaporation drying of water on the gas-liquid boundary formed by the rotation of the substrate.

(10) In the substrate processing method as above in any one of (1) to (9) according to the present invention, the drying gas contains vapor of a substance that is soluble in water and, when dissolved in water, lowers its surface tension.

The above constitution makes it possible to lower the surface tension on the gas-liquid boundary formed by the rotation of the substrate, to draw water toward the zone in which water is present in larger amount, so that movement of the gas-liquid boundary is facilitated.

(11) In the substrate processing method as above (10) according to the present invention, the substance that is liquid before being contained in the gas and, when dissolved in water, lowers its surface tension, is kept at a predetermined temperature.

With the above constitution, the temperature of liquid of the substance that, when dissolved in water, lowers its surface tension, is restored to the predetermined temperature even if heat is removed by evaporation. As a result, the temperature of liquid of the substance that, when dissolved in water, lowers its surface tension does not lower excessively. As a result, it is possible to prevent the amount of vapor of the substance that, when dissolved in water, lowers its surface tension contained in the gas from decreasing.

(12) The substrate processing method as above in any one of (1) to (10) according to the present invention comprises a step of suctioning the water through a holding part for rotatably holding the substrate W (as shown in FIG. 1, for example).

The above constitution makes it possible to suction water adhering to the part for rotatably holding to the substrate, to improve water replacement property, to restrict residual water on the substrate, and prevent water from scattering. It is further possible, when water is supplied more positively to the substrate periphery in comparison with conventional drying by centrifugal force, to prevent the container inside wall or the cover inside wall from being contaminated as the supplied water scatters, or to prevent the substrate top surface from being contaminated again as the supplied water strikes the inside wall and bounces back from there, and to prevent the substrate bottom surface from being contaminated again as the supplied water curls and finds its way onto the bottom surface.

(13) The substrate processing method as above in any one of (1) to (10) according to the present invention comprises a step of suctioning the water on a periphery of the substrate.

The above constitution makes it possible to accelerate the removal of water from the substrate surface and to prevent liquid droplets from remaining on the substrate periphery. Further, it is possible, when water is supplied more positively to the substrate periphery in comparison with conventional drying by centrifugal force, to prevent the container inside wall or the cover inside wall from being contaminated as the supplied water scatters, or to prevent the substrate top surface from being contaminated again as the supplied water strikes the inside wall and bounces back from there, and to prevent the substrate bottom surface from being contaminated again as the supplied water curls and finds its way onto the bottom surface.

(14) In the substrate processing method as above in any one of (1) to (13) according to the present invention, the drying gas flow is caused to move from a central side toward a peripheral side of the substrate while supplying the drying gas to the substrate top surface.

The above constitution makes it possible to assist the movement of water with the centrifugal force produced by the substrate rotation, so that water is completely moved to the periphery before water break occurs on the substrate surface.

(15) In the substrate processing method as above (10) according to the present invention, the drying gas flow is caused to move from a central side toward a peripheral side of the substrate while supplying the drying gas to the substrate top surface; and the content, in the drying gas, of vapor of the substance that, when dissolved in water, lowers its surface tension is higher when the drying gas flow is on the peripheral side of the substrate than when the drying gas flow is on the central side of the substrate.

The above constitution further lowers the surface tension of water on the peripheral side of the substrate. As a result, the force that draws the gas-liquid boundary toward the side on which water is present in larger amount is intensified, so that the substrate surface can be dried while maintaining the substrate rotating speed even if the gas flow moves toward the periphery of the substrate.

(16) In the substrate processing method as above (14) or (15) according to the present invention, the substrate is dried gradually from its center toward periphery while moving the drying gas flow to gradually push and move the water covering the substrate from the substrate center toward the periphery.

With the above constitution, the substrate gradually dries up from the central part of the substrate while the entire substrate is covered with water, and the substrate processing method is realized that is free from developing watermarks.

(17) The substrate processing method as above in any one of (14) to (16) according to the present invention comprises the steps of: ejecting water flow that is thin in area in comparison with the substrate surface from above to the substrate top surface, with a water flow ejecting position located radially outwardly of a gas flow ejecting position; and moving the water flow, along with the movement of the drying gas flow, from the substrate central side toward the peripheral side while ejecting the water flow.

With the above constitution, the water flow pouring position is nearer in radial direction to the periphery than the gas flow pouring position, and the water flow is moved from the substrate central side toward the peripheral side ahead of the gas flow movement. Therefore, it is possible to prevent break of water on the substrate pushed out by centrifugal force and gas flow toward the substrate periphery.

(18) In the substrate processing method as above (17) according to the present invention, a rate of water flow ejected to the substrate top surface is smaller when the water flow is on the substrate peripheral side than when the water flow is on the substrate central side.

The above constitution results in that the flow rate of water supplied to the substrate is smaller on the substrate peripheral side where centrifugal force is greater than on the substrate central side, and makes it possible to prevent liquid from scattering while forming water film on the substrate surface.

(19) In the substrate processing method as above in any one of (14) to (18) according to the present invention, a speed of the drying gas flow movement from the substrate central side toward the peripheral side is slower when the drying gas flow movement is going to stop than when the drying gas flow movement started. Here, the speed at the time when the "movement started" does not include the state of "positive acceleration" from standing state up to a predetermined moving speed, but the speed at the time the acceleration becomes zero.

The above constitution makes it possible to supply gas flow without shortage to the substrate area from which water is to be removed and of which area increases as the gas flow moves toward the periphery.

(20) In the substrate processing method as above in any one of (16) to (19) according to the present invention, as shown in FIG. 4A, for example, the water flow ejecting position is so as the water flow is not affected with the drying gas flow.

The above constitution results in that the surface of water covering the substrate is not disturbed with the gas flow, water film on the substrate is less likely to break, and watermarks are restricted from occurring. The position where the water flow position is not affected with the gas flow is typically a position in point symmetric with respect to the substrate center (rotation center), or the position away by 180 degrees from each other.

(21) In the substrate processing method as above in any one of (1) to (20) according to the present invention, a rotating speed of the substrate is from 30 rpm to 800 rpm.

With the above constitution, when the substrate rotating speed is not less than 30 rpm, there is no shortage in the centrifugal force for removing water and, when not greater than 800 rpm, water droplets flying from the substrate do not bounce back to the cover or cleaning chamber inside wall. Therefore, it is possible to prevent watermarks from appearing. In case a film that is hard to dry such as a heat oxidation film is applied to the substrate bottom surface, a finish drying may be performed at 1000 rpm or below after drying the substrate top surface. As few liquid droplets remain on the substrate surface at the time of the finish drying, bouncing back of liquid droplets from the cup or the like does not cause problems.

(22) In the substrate processing method as above in any one of (16) to (21) according to the present invention, a rotating speed of the substrate is lower when the water flow is on the substrate peripheral side than when the water flow is on the substrate central side.

With the above constitution, the substrate rotating speed is slower when the water flow is present on the substrate peripheral side where the centrifugal force is greater than on the substrate central side. Therefore, it is possible to prevent liquid from scattering while forming water film on the substrate surface.

(23) The substrate processing method as above in any one of (14) to (22) according to the present invention comprises a step of supplying water to a bottom surface of the substrate prior to blowing the drying gas flow; wherein a gas for drying is caused to blow to the substrate bottom surface when the drying gas flow moves.

With the above constitution, drying gas is blown to the substrate bottom surface when the gas flow moves. Therefore, it is possible to shorten the time taken for drying the substrate bottom surface and increase throughput.

(24) The substrate processing method as above in any one of (17) to (23) according to the present invention comprises the steps of: bringing a rotating speed of the substrate to a first predetermined rotating speed; stopping the water flow when the water flow reaches the substrate peripheral end; stopping the drying gas flow movement when the drying gas flow reaches the substrate peripheral end; and increasing the substrate rotating speed with the drying gas flow located at the substrate peripheral end, and stopping the drying gas flow when the substrate rotating speed reaches a second predetermined rotating speed which is higher than the first predetermined rotating speed.

With the above constitution, the substrate rotating speed is increased in the state where the gas flow is on the substrate periphery, and the gas flow is stopped when the substrate rotating speed reaches a second predetermined rotating speed which is higher than a first predetermined rotating speed. Therefore, it is possible to dry the substrate surface so that watermarks do not appear in the area up to the substrate periphery. It is also possible to prevent watermarks from appearing by preventing with centrifugal force the water remaining on the substrate periphery and substrate side from finding its way toward the substrate center.

(25) The substrate processing method as above in any one of (1) to (24) according to the present invention comprises a step of drying a bottom surface of the substrate after removing the water from the substrate top surface.

The above constitution makes it possible to dry the substrate bottom surface under conditions different from the conditions under which the substrate top surface is dried. Incidentally, in the process of drying the substrate bottom surface, typically the substrate side face is also dried.

(26) In the substrate processing method as above (25) according to the present invention, a rotating speed of the substrate is changed during the step of drying the substrate bottom surface.

The above constitution makes it possible to increase the substrate rotating speed without scattering liquid droplets even in case liquid droplets are present on the substrate and the chuck.

(27) In the substrate processing method as above (26) according to the present invention, the change in the substrate rotating speed is made at an acceleration of $(20\pi/3)$ rad/s$^2$ or less.

The above constitution makes it possible to increase the rotating speed more securely without scattering liquid droplets even in case liquid droplets are present on the substrate and the chuck.

(28) To achieve the above object, a substrate processing apparatus according to the present invention comprises, as shown in FIG. 1, for example, a substrate holding part 10 for holding a substrate W generally horizontally and rotating the substrate W; an upper gas supply nozzle 30, disposed above the substrate W held with the substrate holding part 10, for supplying gas to a top surface of the substrate W; a water supply nozzle 20, disposed above the substrate W held with the substrate holding part 10, for supplying water to the substrate W, the water supply nozzle 20 being disposed outwardly of the upper gas supply nozzle 30 in the radial direction of the substrate W; and a moving mechanism (21 to 23, 31 to 33) for moving the upper gas supply nozzle 30 and the water supply nozzle 20 from a central side of the substrate W toward a peripheral side of the substrate W.

The above constitution, provided with the moving mechanism for moving the upper gas supply nozzle and the water supply nozzle from the substrate central side toward the substrate peripheral side, makes it possible to assist the movement of water caused with the centrifugal force produced with the substrate rotation, to complete the water movement toward the periphery of the substrate before a break of water occurs on the substrate. As a result, the substrate processing apparatus is free from producing watermarks on the substrate.

(29) The substrate processing apparatus as above (28) according to the present invention comprises a constant temperature tank for storing, in liquid state at a predetermined temperature, a substance that is to be added as vapor to the gas, and that, when dissolved in the water, lowers its surface tension.

With the above constitution, the temperature of liquid of the substance that, when dissolved in water, lowers its surface tension, is restored to the predetermined temperature even if heat is removed by evaporation. As a result, the temperature of liquid of the substance that, when dissolved in water, lowers its surface tension does not lower excessively. As a result, it is possible to prevent the amount of vapor of the substance that, when dissolved in water, lowers its surface tension contained in the gas from decreasing.

(30) In the substrate processing apparatus as above (28) or (29) according to the present invention, as shown in FIG. 1, for example, which further comprises a holding part suctioning part 16 for suctioning the water adhering to the substrate holding part 10.

The above constitution makes it possible to accelerate the removal of water from the substrate surface.

(31) In the substrate processing apparatus as above in any one of (28) to (30) according to the present invention, as shown in FIG. 1, for example, which further comprises a periphery suctioning part 44 for suctioning the water from a periphery of the substrate W.

The above constitution makes it possible to prevent liquid droplets from remaining on the substrate periphery.

(32) In the substrate processing apparatus as above (31) according to the present invention, as shown in FIG. 1, for example, a holding part suctioning part 16 and the periphery suctioning part 44 have a conductive part 18, 45 made of conductive material and the conductive part 18, 45 is grounded.

The above constitution results in that the substrate is less likely to be charged with static electricity even if it is generated by the substrate rotation or by the suction of water.

(33) The substrate processing apparatus as above in any one of (28) to (32) according to the present invention comprises, as shown in FIG. 1, for example, a lower gas supply nozzle 40, disposed below the substrate W held with the substrate holding part 10, for supplying gas to a bottom surface of the substrate W; wherein the substrate holding part 10 has a roller 11 for contacting an end of the substrate held, and the roller 11 is rotatable about its axis while keeping contact with the substrate held.

With the above constitution, the point of contact between roller and the substrate always shifts, so that the substrate periphery is prevented from being contaminated with the substrate holding part. Besides, as the lower gas supply nozzle is provided, the substrate bottom surface is prevented from being contaminated again, as water is prevented from curling down and finding its way to the substrate bottom surface.

(34) The substrate processing apparatus as above in any one of (28) to (32) according to the present invention comprises, as shown in FIG. 7 and FIG. 8, for example, a bottom surface gas supply nozzle 13v, disposed below the substrate W held with the substrate holding part, for supplying gas to a bottom surface of the substrate W; wherein the substrate holding part has chuck claws 13n for holding the substrate W.

The above constitution provided with the bottom surface gas supply nozzle for supplying gas to the substrate bottom surface makes it possible to dry the substrate bottom surface by supplying gas.

(35) In the substrate processing apparatus as above (34) according to the present invention, as shown in FIG. 7 and FIG. 8, for example, the bottom surface gas supply nozzle 13v is disposed below the approximate center of the substrate W held with the chuck claws 13n and the bottom surface gas supply nozzle 13v is adapted to supply gas by ejection in an inverted conical shape with its apex on the lower side.

The above constitution makes it possible to dry the substrate bottom surface center which is relatively hard to dry while the substrate top surface is being dried. Therefore, it is possible to shorten the time taken to dry the substrate bottom surface, thereby improving throughput.

(36) The substrate processing apparatus as above in any one of (28) to (35) according to the present invention comprises, as shown in FIG. 1, for example, a cover 17 for surrounding at least part of the substrate holding part 10 so that the water adhering to the substrate holding part 10 does not scatter to the substrate held.

With the above constitution, as the water present on the substrate holding part does not scatter to the substrate held, it is possible to prevent watermarks from appearing due to scattered water.

(37) The substrate processing apparatus as above in any one of (28) to (36) according to the present invention comprises, as shown in FIG. 1 and FIG. 7, for example, an upper rinsing water supply nozzle 28 for supplying water to a top surface of the substrate W; and a lower rinsing water supply nozzle 34 (as shown in FIG. 1), 38 (as shown in FIG. 7) for supplying water to a bottom surface of the substrate W.

The above constitution makes it possible to cover the substrate top and bottom surfaces with water before the surfaces are dried, so that watermarks are prevented from being produced by mottled evaporation drying of water.

(38) In the substrate processing apparatus as above (37) according to the present invention, at least one of the water supplied through the water supply nozzle, the water supplied through the upper rinsing water supply nozzle, and the water supplied through the lower rinsing water supply nozzle is heated.

The above constitution facilitates heated water to evaporate. As a result, it is possible to shorten the time taken for drying and improve throughput.

(39) In the substrate processing apparatus as above (37) according to the present invention, the water supplied through the lower rinsing water supply nozzle is heated.

The above constitution facilitates heated water supplied to the substrate bottom surface to evaporate. As a result, it is possible to shorten the time taken for drying the substrate bottom surface and improve throughput.

(40) In the substrate processing apparatus as above in any one of (28) to (39) according to the present invention, as shown in FIG. 1, for example, the moving mechanism 21 to 23, 31 to 33 is adapted such that, when it moves the upper gas supply nozzle 30 and the water supply nozzle 20 from the substrate W central side toward the peripheral side, a moving speed of the upper gas supply nozzle 30 and the water supply nozzle 20 is slower when they are going to stop moving than when they started moving. Here, the moving speed at the time "when they are going to stop moving" is typically the speed at the time when the nozzles are going to stop after moving to the substrate periphery.

The above constitution makes it possible to supply gas flow without shortage according to the increase in the substrate surface area from which water is to be removed per unit time along with the movement of the upper gas supply nozzle toward the periphery. It is also possible to supply water without shortage according to the increase in the substrate area to which water is to be supplied per unit time as the water supply nozzle moves toward the periphery.

(41) In the substrate processing apparatus as above in any one of (28) to (40) according to the present invention, as shown in FIG. 1, for example, a rotating speed of the substrate W is 30 to 800 rpm.

With the above constitution, when the substrate rotating speed is not less than 30 rpm, there is no shortage in the centrifugal force for removing water and, when not greater than 800 rpm, water droplets flying from the substrate do not bounce back from the cover or cleaning chamber inside wall. Therefore, it is possible to prevent watermarks from appearing due to water droplets remaining on the substrate.

(42) The substrate processing apparatus as above in any one of (28) to (41) according to the present invention comprises, as shown in FIG. 1, for example, a control part 48 that causes the substrate W to rotate at a lower rotating speed when the water supply nozzle 20 is on the substrate W peripheral side than when the water supply nozzle 20 is on the substrate W central side.

With the above constitution, the substrate rotating speed is lower when the water supply nozzle is on the substrate peripheral side where centrifugal force is greater than on the substrate central side, so that it is possible to prevent liquid from scattering while forming water film on the substrate surface. Further, because it is possible to prevent liquid from scattering, it is possible to reduce the footprint (installation area) of the substrate processing apparatus and reduce the cup diameter.

(43) The substrate processing apparatus as above in any one of (28) to (42) according to the present invention comprises, as shown in FIG. 1, for example, a control part 48 that controls a rate of water flow supplied through the water supply nozzle 20 to the substrate W to be smaller when the water supply nozzle 20 is on the substrate W peripheral side is smaller than when the water supply nozzle 20 is on the substrate W central side.

With the above constitution, the flow rate of water supplied to the substrate peripheral side, where centrifugal force is greater than on the substrate central side, is smaller than to the substrate central side, so that it is possible to prevent liquid from scattering while forming water film on the substrate surface. Further, because it is possible to prevent liquid from scattering, it is possible to reduce the footprint (installation area) of the substrate processing apparatus and reduce the cup diameter.

(44) The substrate processing apparatus as above in any one of (28) to (43) according to the present invention comprises a control part 48 (as shown in FIG. 1 and FIG. 7, for example) that brings a rotating speed of the substrate W to a first predetermined rotating speed when the upper gas supply nozzle 30 (as shown in FIG. 1 and FIG. 7, for example) and the water supply nozzle 20 (as shown in FIG. 1 and FIG. 7, for example) move from the substrate central side toward the peripheral side, stops the water supply through the water supply nozzle 20 (as shown in FIG. 1 and FIG. 7, for example) when the water supply nozzle 20 (as shown in FIG. 1 and FIG. 7, for example) reaches the substrate peripheral end, increases the substrate rotating speed while stopping the movement of the upper gas supply nozzle 30 (as shown in FIG. 1 and FIG. 7, for example) when the upper gas supply nozzle 30 (as shown in FIG. 1 and FIG. 7, for example) reaches the substrate peripheral end, and stops the gas supply through the upper gas supply nozzle 30 (as shown in FIG. 1 and FIG. 7, for example) when the substrate rotating speed reaches a second predetermined rotating speed which is higher than the first predetermined rotating speed.

With the above constitution, the substrate rotating speed is increased in the state where the gas flow is on the substrate periphery, and the gas flow is stopped when the substrate rotating speed reaches a second predetermined rotating speed which is higher than a first predetermined rotating speed. Therefore, it is possible to dry the substrate top surface so that watermarks do not appear in the area up to the substrate periphery. It is also possible to prevent watermarks from appearing by preventing with centrifugal force the water remaining on the substrate periphery and substrate side from finding its way toward the substrate center.

(45) The substrate processing apparatus as above in any one of (28) to (44) according to the present invention comprises, as shown in FIG. 1, for example, a control part 48 that causes a rotating speed of the substrate W to change at an acceleration of $(20\pi/3)$ rad/s$^2$ or less.

The above constitution makes it possible to change the substrate rotating speed so that liquid droplets do not scatter.

(46) A polishing apparatus according to the present invention comprises, as shown in FIG. 10, for example, the substrate processing apparatus as above in any one of (28) to (45); a polishing unit 110 for polishing the substrate W; and a cleaning unit 50,60 for applying scrub cleaning or ultrasonic cleaning to the substrate W.

The above constitution provides a polishing device that makes it possible to remove contaminants on the substrate surface before the substrate surface is covered with water, to reduce contaminants that become nuclei of water droplets during drying, to reduce probability of watermarks being produced due to the contaminants on the substrate surface, and to form Damascene wiring without producing watermarks on the substrate.

(47) An electroless plating apparatus according to the present invention comprises, as shown in FIG. 14, for example, the substrate processing apparatus as above in any one of (28) to (45); an electroless plating unit 305a,305b for applying electroless plating to the substrate W; and a cleaning unit 50, 60 for applying scrub cleaning or ultrasonic cleaning to the substrate W.

The above constitution provides an electroless plating device that makes it possible to remove contaminants on the substrate surface before the substrate surface is covered with water, to reduce contaminants that become nuclei of water droplets during drying, to reduce probability of watermarks being produced due to the contaminants on the substrate surface, and to form Damascene wiring without producing watermarks on the substrate.

(48) A substrate processing apparatus according to the present invention comprises, as shown in FIG. 1, for example, a control system 48 for controlling operations in which: a substrate holding part 10 for holding and rotating a substrate W rotates the substrate in a generally horizontal plane; water is supplied through rinsing water supply nozzles 28,34 disposed respectively above and below the substrate W to cover a top surface of the substrate W with the water; an upper gas supply nozzle 30 is moved from a vicinity of a center of the substrate W toward a periphery of the substrate W while supplying gas through the upper gas supply nozzle 30 to the substrate W top surface; at the same time, a water supply nozzle 20 is moved to a position radially outwardly of the upper gas supply nozzle 30 while supplying water to the substrate top surface W, and water on the substrate top surface is removed.

With the above constitution, a control system is provided that controls the action of removing water on the substrate top surface by moving the water supply nozzle, while supplying water, to a position which is radially outwardly of the upper gas supply nozzle simultaneously with moving the upper gas supply nozzle from the vicinity of substrate center toward the periphery. Therefore, the substrate processing apparatus is capable of drying the substrate after being cleaned without locally leaving water droplets and without producing watermarks. In case the action of removing water from the substrate bottom surface is controlled simultaneously with moving the lower gas supply nozzle from the vicinity of the substrate center toward the periphery, the substrate processing apparatus becomes of a high precision and capable of preventing re-contamination of the substrate bottom surface due to water curling down and finding its way to the substrate bottom surface.

(49) To achieve the above object, a control program according to the present invention, installed on a computer connected to a substrate processing apparatus, for causing the computer to control the substrate processing apparatus using a substrate processing method comprises the steps of: applying smoothing process or electroless plating process to a substrate; holding and rotating the substrate, which is held generally horizontally and rotated in a horizontal plane; covering a top surface of the substrate, to which the process is applied, with water; and blowing to the substrate top surface drying gas flow that is thin in area in comparison with the substrate surface; wherein the water is removed from the substrate top surface by the rotation in the horizontal plane while blowing the drying gas flow.

The above constitution provides a control program applicable to the substrate processing apparatus capable of performing substrate cleaning process without producing watermarks.

(50) A control program according to the present invention, installed on a computer connected to a substrate processing apparatus, for causing the computer to control the substrate processing apparatus using a substrate processing method comprises the steps of: holding and rotating a substrate, which is held generally horizontally and rotated in a horizontal plane; and blowing a drying gas flow and a water flow, which are thin in area in comparison with the substrate surface, from above onto a top surface of the substrate, in which the drying gas flow and the water flow are moved from a central side of the substrate toward a peripheral side of the substrate while keeping the water flow located outwardly of the drying gas flow in the radial direction of the substrate.

The above constitution provides a control program applicable to the substrate processing apparatus capable of performing substrate cleaning process without producing watermarks.

(51) A control program according to the present invention, installed on a computer connected to a substrate processing apparatus, for causing the computer to control the substrate processing apparatus using a substrate processing method comprising the steps of: holding and rotating a substrate, which is held generally horizontally and rotated in a horizontal plane; covering a top surface of the substrate with water; and blowing respectively a drying gas flow and a water flow, which are thin in area in comparison with the substrate surface, to the substrate top surface, in which the water on the substrate top surface is removed while the drying gas flow and the water flow blown to the top surface are moved from a central side of the substrate toward a peripheral side of the substrate while keeping the water flow located outwardly of the drying gas flow in the radial direction of the substrate.

The above constitution provides a control program applicable to the substrate processing apparatus capable of performing substrate cleaning process without producing watermarks. Besides, in case the substrate bottom surface as well as top surface is covered with water, drying gas flow is blown to the bottom surface, and water on the substrate bottom surface is removed while moving the drying gas flow from the substrate central side toward the peripheral side, it is further possible to prevent re-contamination of the substrate bottom surface due to water curling down and finding its way to the substrate bottom surface.

(52) The control program as above (50) or (51) according to the present invention performs at least one of: a control of making a rotating speed of the substrate lower when the water flow is on the substrate peripheral side than when the water flow is on the substrate central side, and a control of making a rate of the water flow smaller when the water flow is on the substrate peripheral side than when the water flow is on the substrate central side.

With the above constitution, in case the substrate rotating speed is controlled, it is possible to reduce the substrate rotating speed when the water supply nozzle is on the substrate peripheral side on which centrifugal force is greater than on the substrate central side, and to prevent liquid from scattering while forming water film on the substrate surface. Besides, in case the rate of water flow is controlled, the flow rate of water supplied to the substrate is smaller on the peripheral side on which centrifugal force is greater than on the substrate central side, so it is possible to prevent liquid from scattering while forming water film on the substrate surface.

(53) The control program as above in any one of (50) to (52) according to the present invention performs a control of supplying water to a bottom surface of the substrate prior to blowing the drying gas flow, and blowing gas for drying to the substrate bottom surface when the drying gas flow moves.

With the above constitution, as the drying gas is blown to the substrate bottom surface when the gas flow is moved, it is possible to shorten the time taken for drying the substrate bottom surface and improve throughput.

(54) The control program as above in any one of (50) to (53) according to the present invention performs a control of bringing a rotating speed of the substrate to a first predetermined rotating speed when the drying gas flow and the water flow move from the substrate central side toward the peripheral side, stopping the water flow when the water flow reaches the substrate peripheral end, increasing the substrate rotating speed while stopping the drying gas flow movement when the drying gas flow reaches the substrate peripheral end, and stopping the drying gas flow when the substrate rotating speed reaches a second predetermined rotating speed which is higher than the first predetermined rotating speed.

With the above constitution, the substrate rotating speed is increased in the state where the gas flow is on the substrate periphery, and the gas flow is stopped when the substrate rotating speed reaches a second predetermined rotating speed which is higher than a first predetermined rotating speed. Therefore, it is possible to dry the substrate surface so that watermarks do not appear in the area up to the substrate periphery. It is also possible to prevent watermarks from appearing by preventing with centrifugal force the water remaining on the substrate periphery and substrate side from finding its way toward the substrate center.

(55) The control program as above in any one of (49) to (54) according to the present invention comprises a step of drying a bottom surface of the substrate, after the removing the water from the substrate top surface;

wherein a rotating speed of the substrate is changed at an acceleration of $(20\pi/3)$ rad/s$^2$ or less in the step of drying the substrate bottom surface.

The above constitution makes it possible to increase the substrate rotating speed without scattering liquid droplets even in case liquid droplets remain on the substrate.

(56) A method of manufacturing a semiconductor device comprises the steps of: cleaning a substrate using the substrate processing method as above in any one of (1) to (27), and forming a semiconductor device on the substrate.

The above constitution makes it possible to produce semiconductor devices using the substrate free from watermarks.

This application is based on the Patent Applications No. 2005-031170 filed on Feb. 7, 2005 and 2005-295744 filed on Oct. 7, 2005 in Japan, the contents of which are hereby incorporated in its entirety by reference into the present application, as part thereof.

The present invention will become more fully understood from the detailed description given hereinbelow. However, the detailed description and the specific embodiment are illustrated of desired embodiments of the present invention and are described only for the purpose of explanation. Various changes and modifications will be apparent to those ordinary skilled in the art on the basis of the detailed description.

The applicant has no intention to give to public any disclosed embodiment. Among the disclosed changes and modifications, those which may not literally fall within the scope of the patent claims constitute, therefore, a part of the present invention in the sense of doctrine of equivalents.

The use of the terms "a" and "an" and "the" and similar referents in the context of describing the invention (especially in the context of the following claims) are to be construed to cover both the singular and the plural, unless otherwise indicated herein or clearly contradicted by context. The use of any and all examples, or exemplary language (e.g., "such as") provided herein, is intended merely to better illuminate the invention and does not pose a limitation on the scope of the invention unless otherwise claimed.

This invention provides a substrate processing method that makes it possible to dry a substrate without locally leaving water droplets on the substrate after being cleaned and without producing watermarks by covering in advance with water the substrate surface having a contact angle of not less than 30 degrees relative to water, and removing water from the substrate surface by rotation in horizontal plane while blowing drying gas flow.

In case a moving mechanism is provided to move the upper gas supply nozzle and the water supply nozzle from the substrate central side toward the peripheral side, it is possible to assist the movement of water caused with the centrifugal force produced with the substrate rotation, to complete the water movement toward the periphery of the substrate before water break occurs on the substrate by continuing positive supply of water so that no water break occurs. Therefore, it is possible to solve the problem that water droplets occur due to break of liquid film on the substrate periphery, which is likely to occur at rotating speed at which the centrifugal force on the periphery exceeds the surface tension and the substrate diameter is in particular not less than 200 mm. Thus, the substrate processing apparatus does not produce watermarks.

DETAILED DESCRIPTION OF THE INVENTION

Figure 1A:
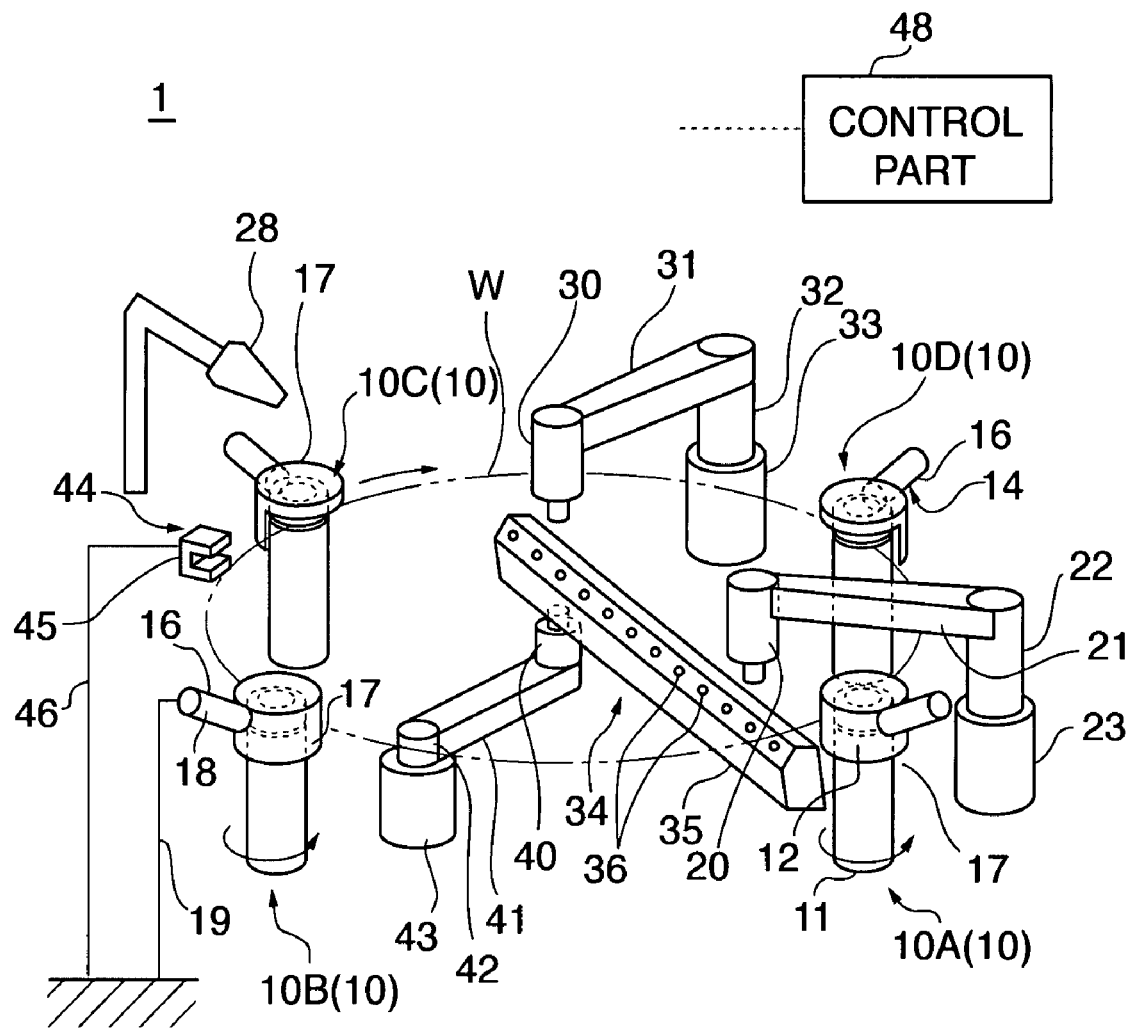
FIG. 1A is a schematic perspective view of a substrate processing apparatus as an embodiment of the present invention.

Embodiments of the present invention are described below in reference to appended drawings. In the drawings, the same parts or counterparts are provided with the same reference numerals and symbols, omitting redundant explanations.

FIG. 1A is a schematic perspective view of a substrate processing apparatus 1 as an embodiment of the present invention. The substrate processing apparatus 1 is made up of: a substrate holding part 10 for holding and rotating a substrate W (indicated with a dash-and-double-dotted line in FIG. 1A); a water supply nozzle 20, and a top surface fixed rinsing nozzle 28 as a rinsing water supply nozzle, for supplying cleaning water to the top surface of the substrate W; an upper gas supply nozzle 30 for supplying drying gas to the top surface of the substrate W; a bottom surface multi-hole rinsing nozzle 34 as a rinsing water supply nozzle for supplying cleaning water to the bottom surface of the substrate W; a lower gas supply nozzle 40 for supplying drying gas to the bottom surface of the substrate W; a holding part suction part 14 for suctioning water adhering to the substrate holding part 10; a periphery suctioning part 44 for suctioning water off the substrate W periphery; and a control part 48 for controlling the action of the above components.

Here, before explaining the substrate processing apparatus 1 more in detail, a typical substrate W to be cleaned with the substrate processing apparatus 1 is described.

The substrate W is formed with Damascene wiring. The Damascene wiring is formed by forming wiring grooves of a predetermined pattern in a substrate covered with an insulation film, and filling the grooves with metal. In recent years, it is a common practice to use copper or its alloy as the wiring metal, and the so-called low dielectric constant film (low-k film) as the insulation film. Such wiring is called the Cu low-k wiring. The Cu low-k wiring generally has a property that the copper part is easily wetted with water (hydrophilic) while the low dielectric constant film part is water-repellent (hydrophobic). As the hydrophilic parts and hydrophobic parts are randomly formed on the wiring surface, the substrate W exhibits uneven wetting property. Incidentally, the inventors have had the following findings: While the so-called low dielectric constant film itself has a contact angle to water of at least 60 degrees or greater, when film-planing process such as CMP is applied in order to form wiring, part of the chemical bond such as the C—H radical exhibiting hydrophobic property is broken and turns to exhibit hydrophilic property. As a result, the contact angle of the low dielectric constant film after the process lowers down to about half the original value. Further based on the above facts, we have found that, in case of Cu low-k wiring, the contact angle between the insulation film and water is 30 to 80 degrees. We also recognized the fact that water stain (watermark) is likely to occur in parts having the contact angle to water of 30 to 80 degrees. Such a surface as described above is so to speak a surface having an intermediate wetting property between hydrophobic and hydrophilic, and is likely to develop watermarks.

Figure 2:
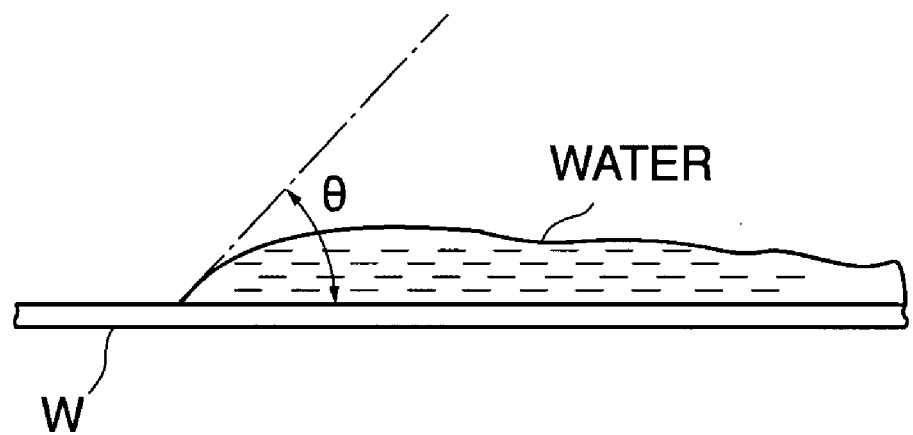
FIG. 2 is a schematic view for explaining the contact angle between the substrate and water.

In reference to FIG. 2, the contact angle to water is described. The contact angle to water mentioned here is the angle between the substrate W surface and the gas-liquid boundary in contact with the substrate surface, indicated as θ in FIG. 2. The wetting property (degree of being wetted easily) of the surface is evaluated with the contact angle θ. In other words, the smaller the contact angle θ of the surface, the more easily the surface is wetted (higher in hydrophilic property); and the greater the angle θ, the less easily wetted (higher in hydrophobic property).

Here, in reference to FIG. 1, the substrate processing apparatus 1 is described more in detail.

Figure 3:
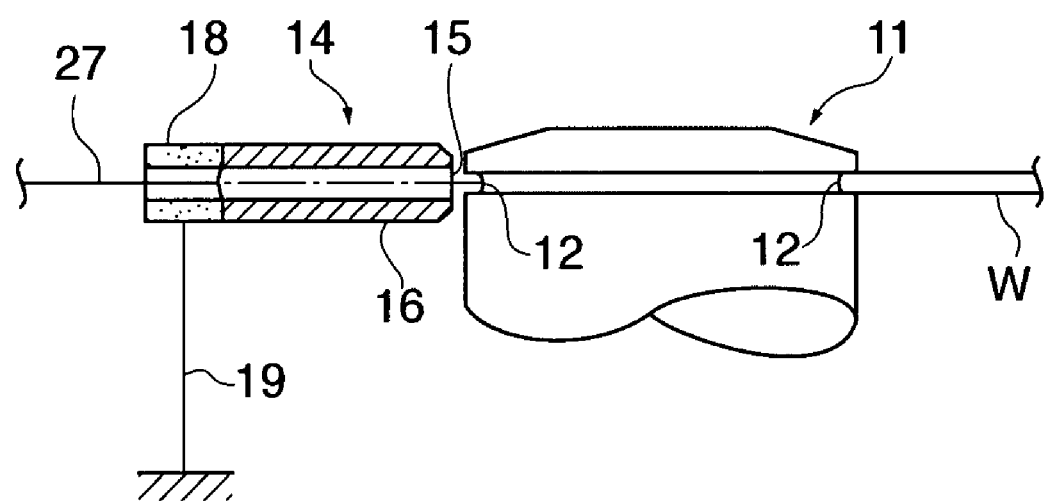
FIG. 3 is a detailed partial view for explaining the roller of the substrate holding part and the vicinity thereof.

The substrate holding part 10 has rollers 11 each having a clamping part 12 for holding the periphery of the substrate W (See FIG. 3). While the substrate processing apparatus 1 of this embodiment is provided with four substrate holding parts 10A, 10B, 10C, and 10D, the number is not limited to four as long as the substrate W is held appropriately; it may be three or more. In the case of three, the rollers are less likely to interfere with each other to be in good balance. In the case of four or more, as the substrate is supported at many points, the substrate is less likely to have problem in strength even if a relatively large force is applied. Particularly preferable number is four to six. Incidentally, the substrate holding parts 10A to 10D are of an identical constitution. When they need be explained separately, they are referred to as the substrate holding part 10A, ..., and in collective explanation, as the substrate holding part 10. The substrate W is held generally horizontally with the substrate holding parts 10A to 10D. A clamping part 12 of the substrate holding part 10 comes into contact with the periphery of the substrate W while exerting a predetermined pressing force directed toward the approximate center of the substrate W. A rotating drive means (not shown) rotates all the rollers 11 of the substrate holding part 10 about their axes at predetermined identical rotating speed and in identical direction to hold the substrate W while applying rotating force to the substrate W by the friction between the substrate holding part 10 and the periphery of the substrate W. As long as it is possible to rotate the substrate W, it may be adapted such that at least one of the substrate holding parts 10A to 10D be driven to rotate. As the material of the roller 11 here, PVDF, a chemical-resistant fluorine-based resin, is used. As long as there is no problem in releasing the substrate held, irrespective of the number of the rollers, it is adapted such that holding forces of all the rollers be directed toward the substrate center.

Figure 1B:
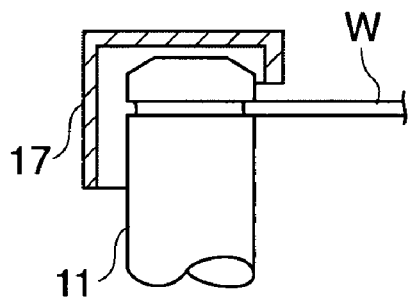
FIG. 1B is partial sectional view of the substrate holding part of a substrate processing apparatus as an embodiment of the present invention.
Figure 1C:
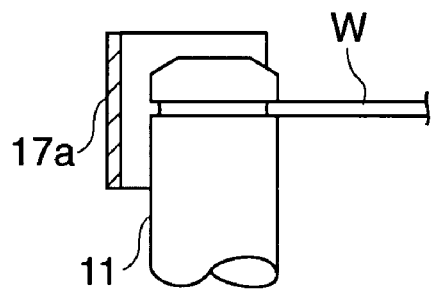
FIG. 1C is partial sectional view of the substrate holding part of a substrate processing apparatus as an embodiment of the present invention.

In reference to FIG. 3, the vicinity of the roller 11 is described. FIG. 3 is a detailed partial view for explaining the vicinity of the roller of the substrate holding part. A holding part suctioning part 14 for suctioning water present on the substrate holding part 10 is provided in the vicinity of the clamping part 12 of the roller 11. The holding part suctioning part 14 is provided with a holding part suctioning nozzle 16 having a suctioning port 15 for suctioning fluid like liquid. Here, the suctioning port 15 is placed close to the clamping part 12, at a distance of for example not greater than 5 mm, to suction fluid adhering to the clamping part 12. The suctioning port 15 is connected to a suctioning pipe 27. The suctioning pipe 27 is connected through a gas-liquid separator (not shown) to a vacuum source (not shown) to suction water with vacuum. As the vacuum source, an ejector, a vacuum pump or the like is used. The holding part suctioning nozzle 16 has a conductive part 18 made of conductive material. The conductive part 18 is located at the fore-end of the holding part suctioning nozzle 16, and grounded through a lead 19. In this embodiment, while only part of the holding part suctioning nozzle 16 is made of conductive material, the entire holding part suctioning nozzle 16 may be made of conductive material. Further, at least one of the four holding part suctioning nozzles 16 need be provided with the conductive part 18. A cover 17 (See FIG. 1) is provided in the upper part of the substrate holding part 10 around the upper end of the roller 11 to prevent water adhering to the substrate holding part 10 from scattering to the substrate W surface. As shown in FIG. 1B in detail, the cover 17 is partially cut away to avoid contact with the substrate W. In other words, the cover 17 is placed so that water droplets cannot scatter in the direction of the substrate W beyond the roller 11 or upward. Alternatively, it may be made as a cover 17a shown in FIG. 1C with part of it above the roller 11 and above the substrate W made open. The holding part suctioning nozzle 16 is placed to penetrate the cover 17 in a position opposite the substrate W beyond the roller 11. The substrate holding part 10, the holding part suctioning part 14, and the cover 17 are secured to a holding part moving means (not shown). As the holding part moving means moves away from and toward the substrate center horizontally, the substrate W is released and held.

Referring again to FIG. 1, the substrate processing apparatus 1 is further explained. The water supply nozzle 20 is placed above the substrate W held generally horizontally with the substrate holding part 10. The water supply nozzle 20 is adapted to supply water to the central part of the substrate top surface. The water supply nozzle 20 is placed at an angle of 60 to 90 degrees to the substrate W top surface. To supply water at low flow rate so as not to give impact to the substrate W, the hole diameter of the water supply nozzle 20 is preferably not less than 1 mm. On the other hand, the hole diameter is preferably not greater than 6 mm so as to avoid excessive water supply. In this embodiment, the hole diameter of the water supply nozzle 20 is 2 mm. With such a nozzle, it is possible to eject water flow that is thin in area in comparison with the surface of the substrate of a diameter of 200 to 300 mm.

While water supplied through the water supply nozzle 20 is typically pure water, it is possible to use de-ionized water free from dissolved salts or dissolved organic substances, carbon dioxide gas solution water, functional water (such as hydrogen water and electrolyzed ion water), alcohol such as IPA, organic solvent, etc., depending on the purpose. Using water containing dissolved salts or dissolved organic substances increases the probability of increasing the watermark size and poor reliability. Therefore, using water free from impurities is preferred. To remove dissolved salts in water, methods such as reverse osmosis membrane method, ion exchange method, etc. may be applicable. To remove dissolved organic substances in water, methods such as reverse osmosis membrane method, ultra-filtration membrane method, UV decomposition method, etc. may be applicable. Using carbon dioxide gas solution water makes it possible to increase the conductivity of the substrate W. Carbon dioxide expels dissolved oxygen and restricts oxygen from dissolving anew. As the low dielectric constant film where watermarks are easily developed is poor in wetting property (tends to be hydrophobic), attempt of flinging water by rotation tends to generate static electricity. The substrate charged with static electricity tends to attract foreign matter or the like. As the generation of static electricity is due to low conductivity of de-ionized water, it is preferable to apply carbon dioxide dissolution, a method of increasing conductivity without increasing dissolved salts or dissolved organic substances. To dissolve carbon dioxide, it is a common practice to use a method in which carbon dioxide is dissolved under pressure through a gas dissolution membrane into the de-ionized water side. In that case, it is preferable to remove as much as possible dissolved oxygen and dissolved nitrogen before dissolving carbon dioxide through a degassing membrane, as this remarkably improves dissolution efficiency. Incidentally, when the UV method is used to decompose dissolved organic substances, carbon dioxide and hydrogen are occasionally produced as byproducts, which may be used for the above purpose. In this specification, unless specifically mentioned separately, the term "water" should be interpreted to include, in addition to pure water and de-ionized water, carbon dioxide solution water, functional water (such as hydrogen water and electrolyzed ion water), alcohol such as IPA, organic solvent, mixture of such alcohol and pure water, the so-called water solution.

The water supplied through the water supply nozzle 20 may be appropriately chosen out of pure water, de-ionized water, carbon dioxide solution water, functional water (such as hydrogen water and electrolyzed ion water), alcohol such as IPA, organic solvent, etc., depending on various conditions such as: the type of substrate W, wiring pattern constitution on the substrate W, water ejection angle, atmosphere (temperature, pressure, cleanliness degree, etc.) the substrate processing apparatus 1 is placed in. The above choice is typically implemented with the control part 48. In case liquid of high wetting property to the substrate and high volatility such as alcohol or organic solvents are used, it is easy to form a thin liquid film at a low flow rate on the substrate W and also to shorten the substrate drying time. The liquid supplied through the water supply nozzle 20 may also be mixture of a predetermined ratio of the above-mentioned alcohol and pure water. In this case, the amount of alcohol used may be reduced, so that the process running cost may be lowered. Further, the flow rate of the water supplied through the water supply nozzle 20 may be changed. Changing the flow rate of water supplied through the water supply nozzle 20 is typically implemented with the control part 48.

The water supplied through the water supply nozzle 20 is preferably heated up to a temperature not less than room temperature below the boiling point of water, for example between 25° C. and 65° C., preferably between 30° C. and 60° C. Heating water facilitates water to evaporate and permits to increase the swing speed of the upper gas supply nozzle 30, as will be described later, and shorten the substrate drying time. On the other hand, 65° C. or lower is preferable from the viewpoint of bringing water into contact with alcohol such as IPA. Water is heated typically with a heater provided around a delivery pipe (not shown) connected to the water supply nozzle 20. Alternatively, it is also possible to make water flow through a separately provided heater or heat exchanger, and introduce the heated water to the water supply nozzle 20. Besides, a top surface fixed rinsing nozzle 28 is provided in the vicinity of the substrate W for supplying water similar to that used with the water supply nozzle 20 to the substrate W top surface. It is also preferable to heat the water supplied through the top surface fixed rinsing nozzle 28 like the water supplied through the water supply nozzle 20.

The upper gas supply nozzle 30 is placed above the substrate W held generally horizontally with the substrate holding part 10, so that drying gas flow that is thin enough in area in comparison with the surface of the substrate W, may be ejected to the substrate W. The hole diameter of the upper gas supply nozzle 30 is preferably not less than 1 mm because too fast a flow speed causes liquid to scatter, and not more than 4 mm because too slow a flow speed results in poor water removing force. The expression "drying gas flow that is thin enough in area in comparison with the surface of the substrate W" refers to the flow of the extent that, when ejected at right angles to the horizontal substrate entirely covered with water, leaves water coaxially on the periphery of the gas flow, typically of the diameter of the gas flow supplied with a nozzle. The thin flow, unlike a thick one, does not require too much gas, and is capable of removing water off the substrate top surface with appropriate intensity. An excessive force is not exerted to the substrate either. With the drying gas ejected through the upper gas supply nozzle 30 described above, water on the substrate W top surface is removed, and the substrate W top surface is dried. In case the gas supply is ejected obliquely to the substrate W surface to dry the central area of the substrate W, the area around the central area dries up earlier than the central area, so that water remaining on the central area comes to the area already dried up, and so there is a risk of causing watermarks. Also in case of the oblique ejection, there is a problem that the gas striking area widens and siccative ability lowers. Therefore, the direction of gas supply to the substrate W is preferably at right angles to the substrate W surface. So the upper gas supply nozzle 30 is disposed at right angles to the substrate W surface. In this way, drying gas is ejected through the respective upper gas supply nozzles 30 at right angles to the substrate W surface. Incidentally, while the number of the gas flow ejected through the upper gas supply nozzle 30 is typically one, it may be plural.

The gas ejected through the upper gas supply nozzle 30 is typically inert gas such as nitrogen. While using air as the gas ejected through the upper gas supply nozzle 30 may help reduce cost, it is necessary to remove in advance contaminants in solid, gas, or vapor state such as by the use of chemical filters. On the other hand, using inert gas is more preferable as it reduces the possibility of oxidation of the substrate surface and the possibility of adverse effect on the next process. While the inert gas is typically nitrogen ($N_2$) gas, it is also possible to use carbon dioxide gas, or other inert gas such as argon gas. Nitrogen gas is easily available and is easy to handle. Besides, as nitrogen is one ingredient of the atmosphere, no special post-process is necessary. Gas supply rate should be sufficient for driving out water from the substrate central toward the periphery while assisting centrifugal force. In case of the "separated type" described later, the substrate rotating speed is equal to or below 100 rpm and so the effect of centrifugal force is small. Therefore, the gas supply rate is specifically not less than 5 liters/min, preferably not less than 10 liters/min, more preferably not less than 50 liters/min. In case of the "integrated type" described later, the substrate rotating speed is not less than 100 rpm and so the effect of centrifugal force is great. Therefore, it is specifically not less than 1 liters/min, preferably not less than 3 liters/min. The pressure of gas ejected through the upper gas supply nozzle 30 is preferably 5 to 350 kPa. The relative humidity of gas ejected through the upper gas supply nozzle 30 is preferably not greater than 10%. The reason is that, when the relative humidity of gas is made not greater than 10%, evaporation drying of water on the gas-liquid boundary formed by the rotation of the substrate W is accelerated and the movement of the water toward the periphery of the gas-liquid boundary occurs more efficiently.

Gas ejected through the upper gas supply nozzle 30 may contain vapor of a substance that, when dissolved in water, reduces its surface tension. When drying-use gas containing vapor of the surface tension-lowering substance is supplied to the gas-liquid boundary formed by the rotation of the substrate W, the substance dissolves in part of the water present on the boundary to lower the surface tension of the part in which the substance dissolved. When the surface tension on the boundary part lowers, the surface tension on part of the water present in abundance (bulk part) becomes higher, so that water is drawn toward the bulk side, and that movement toward the periphery of the boundary occurs more efficiently. The substance that, when dissolved in water, lowers the surface tension of water includes hydrophilic solvents for example: isopropyl alcohol, di-acetone, ethyl-glycol, ethyl-acetate, and methyl-pyrrolidone; and their mixture. Gas ejected through the upper gas supply nozzle 30 may be chosen out of nitrogen or inert gas, air free from contaminants, vapor of alcohol such as IPA or organic solvent, depending on various conditions such as: the type of substrate W, wiring pattern constitution on the substrate W, atmosphere (temperature, pressure, cleanliness degree, etc.) the substrate processing apparatus 1 is placed in. The gas chosen may be appropriately adjusted for relative humidity by heating or the like, or the surface tension-lowering substance may be added to the gas chosen. The above choices are typically controlled with the control part 48.

In case vapor of the substance that, when dissolved in water, lowers its surface tension is contained in the gas ejected through the upper gas supply nozzle 30, the substance that, when dissolved in water, lowers its surface tension, before being contained in the gas, is typically stored as liquid in the constant temperature tank. The constant temperature tank is a container capable of keeping the liquid stored therein at a predetermined temperature. In case the gas is nitrogen ($N_2$) and the substance that lowers surface tension of water when dissolved in water is isopropyl alcohol (IPA), IPA is stored in tightly closed state in a cylindrical constant temperature tank made of metal, for example stainless steel. An inflow pipe for introducing $N_2$ gas into the constant temperature tank and an outflow pipe for guiding the $N_2$ gas containing IPA vapor from the constant temperature tank to the upper gas supply nozzle 30 penetrate the top end face of the constant temperature tank. The end of the inflow pipe present in the cylindrical constant temperature tank is immersed in the liquid IPA. On the other hand, the end of the outflow pipe present in the constant temperature tank is located above the liquid IPA in a space filled with gas, and is not immersed in the liquid IPA. A contact type of liquid level sensor is provided in the constant temperature tank to keep the IPA liquid level within a predetermined range constant. The liquid level sensor detects high and low levels of the IPA liquid in the constant temperature tank. When the liquid level sensor detects a low level, a pump is started and IPA liquid is supplied to the constant temperature tank. When the liquid level sensor detects a high level, the pump is stopped and supplying IPA liquid to the constant temperature tank is stopped. It is preferable to provide a cylindrical partition, with both ends open, surrounding the inflow pipe, in the constant temperature tank to prevent incorrect action of the liquid level sensor due to bubbles of $N_2$ gas supplied to the IPA liquid. The cylindrical partition is disposed with its axis parallel to the constant temperature tank axis to surround the ends of the inflow and outflow pipes in the tank. Because of the purpose of providing the cylindrical partition for preventing $N_2$ gas bubbles from reaching the liquid level sensor, the liquid level sensor is located outside the cylindrical partition. Alternatively, it is also possible to surround the liquid level sensor with the cylindrical partition so that the inflow pipe is located outside the cylindrical partition.

To keep IPA liquid at a predetermined temperature, at least part of the constant temperature tank holding IPA liquid is surrounded with water of a predetermined constant temperature. If the temperature of IPA liquid lowers due to evaporation heat when IPA turns from liquid into vapor, saturation vapor pressure of IPA lowers, saturation concentration of IPA lowers, and the amount of IPA vapor contained in $N_2$ gas decreases. To prevent the above, at least part of the constant temperature tank holding IPA liquid is surrounded with water of a predetermined constant temperature. To keep IPA liquid in the constant temperature tank at a predetermined temperature, the constant temperature tank is typically surrounded with a bowl-shaped water jacket. The water jacket is provided with a constant temperature inflow pipe in the lower part and with a constant temperature outflow pipe in the upper part, opposite the inflow pipe. The water jacket and IPA liquid are kept at a predetermined temperature by flowing water of predetermined constant temperature through the water jacket. For example, in case IPA liquid is to be kept at 20° C., water of 20° C. is supplied to the water jacket.

To make $N_2$ gas ejected from the upper gas supply nozzle 30 contain IPA vapor, $N_2$ gas is bubbled through the inflow pipe into the IPA liquid. Then, IPA vapor is saturated with $N_2$ gas, collects above IPA liquid in the constant temperature tank, and is guided out of the constant temperature tank through the outflow pipe to the upper gas supply nozzle 30. Adjusting the amount of IPA vapor contained in $N_2$ gas ejected through the upper gas supply nozzle 30 is typically made by mixing $N_2$ gas from a separate line for dilution into the $N_2$ gas saturated with IPA gas and guided to the upper gas supply nozzle 30.

The water supply nozzle 20 is attached to the fore-end of a swing arm 21. A swing shaft 22 of the swing arm 21 is connected to a drive source 23. On the other hand, the upper gas supply nozzle 30 is attached to the fore-end of a swing arm 31. A swing shaft 32 of the swing arm 31 is connected to a drive source 33. The swing arms 21, 31, swing shafts 22, 32, and drive sources 23, 33 constitute a moving mechanism. Incidentally, the water supply nozzle 20 and the upper gas supply nozzle 30 may be attached to the same swing arm. In that case, using the same moving mechanism is advantageous in installation space and cost. In the following, the type in which both the water supply nozzle 20 and the upper gas supply nozzle 30 are respectively provided with moving mechanisms is called the "separated type" and the type using a common moving mechanism is called the "integrated type." As the drive source 23 is operated, the swing arm 21 swings, the water supply nozzle 20 moves along the radial direction of the substrate W, and at the same time, the upper gas supply nozzle 30 also moves along the radial direction of the substrate W. Here, the positional relationship between the water supply nozzle 20 and the upper gas supply nozzle 30 is described using the figures.

Figure 4A:
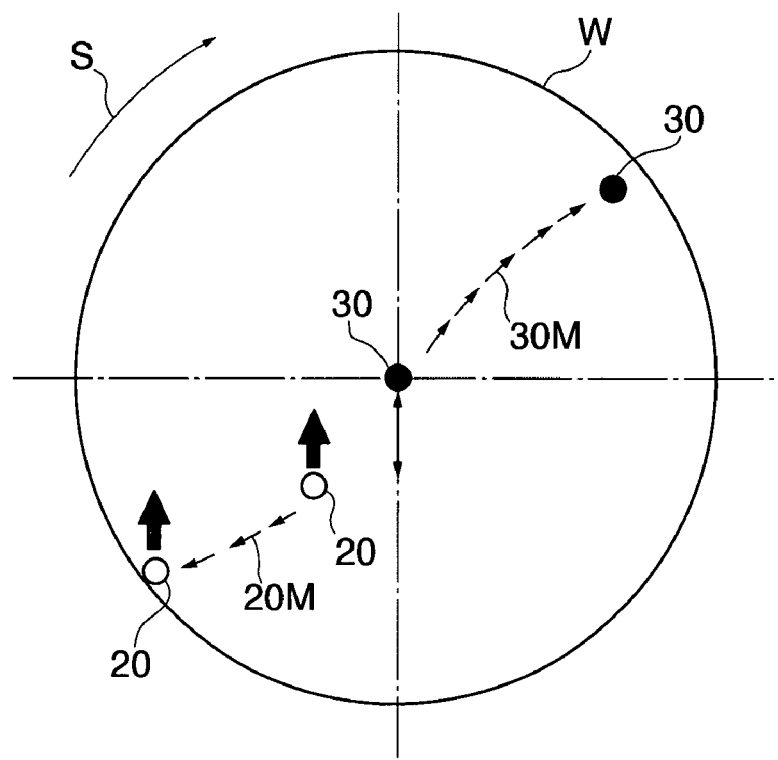
FIG. 4A illustrates positional relationship between the water supply nozzle and the upper gas supply nozzle, which are separated from each other, and their loci.
Figure 4B:
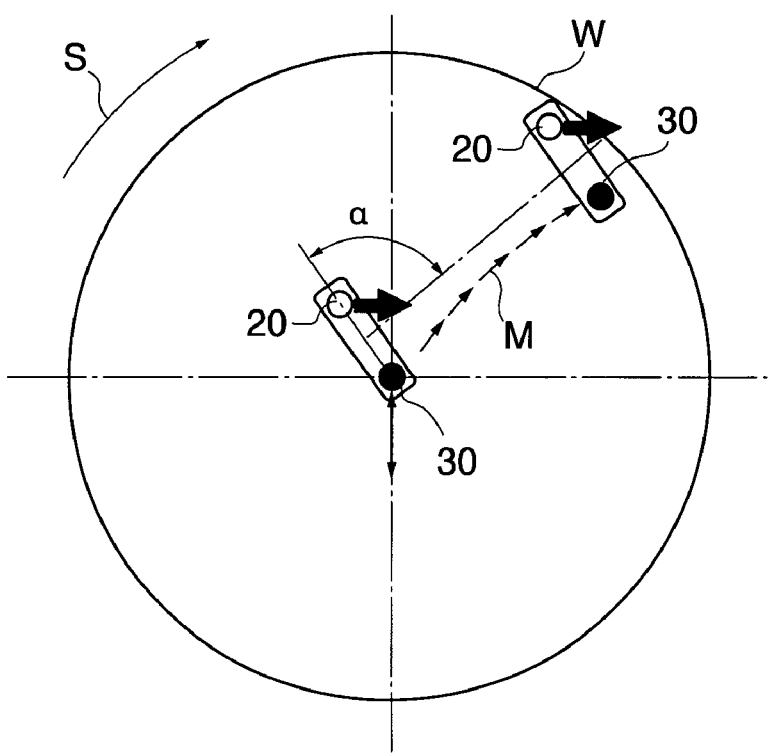
FIG. 4B illustrates positional relationship between the water supply nozzle and the upper gas supply nozzle, which are integrated, and their loci.

FIG. 4 illustrates positional relationship between the water supply nozzle 20 and the upper gas supply nozzle 30 and their loci, with FIG. 4A showing the separated type and FIG. 4B showing the integrated type.

As shown in FIG. 4A, with the separated type, first, the upper gas supply nozzle 30 is located approximately in the center of the substrate W, and the water supply nozzle 20 is disposed toward the periphery of the substrate W. That is, the water supply nozzle 20 is located outwardly of the upper gas supply nozzle 30 in the radial direction of the substrate W. When the substrate W rotates in the direction S (clockwise) in the figure, the swing arms 21, 31 swing respectively about the swing shafts 22, 32 so that the water supply nozzle 20 and the upper gas supply nozzle 30 move independently radially outward. As the swing arms 21, 31 swing, the water supply nozzle 20 moves along the arcuate locus 20M indicated in the figure, and the upper gas supply nozzle 30 moves along the arcuate locus 30M, respectively. Here, if the swing arms 21, 31 are long enough, the arcuate loci become almost linear. While the word swing is used here, the nozzles make unidirectional movement from the substrate center toward outside while spouting gas or water. In other words, the nozzles turn. However, because the arms make opposite movement when they return to the cleaning start position, the word swing is used for the movement in both directions. The water supply nozzle 20 and the upper gas supply nozzle 30, in the process of movement, are in relative positions in which the gas supplied through the upper gas supply nozzle 30 does not interfere with the water supplied through the water supply nozzle 20. Typically it is preferable as shown with the loci 20M, 30M in FIG. 4A that the water supply nozzle 20 is in a symmetric position of the upper gas supply nozzle 30 beyond the center of the substrate W. However, the positions are not limited to the above, but preferably the angular positions of both the nozzles as seen from the substrate center are apart from each other, in both positive and negative, by not less than 30 degrees, preferably 60 degrees, more preferably 90 degrees, most preferably 135 degrees. This prevents the liquid surface from being disturbed and watermarks from appearing.

The water supply nozzle 20 and the upper gas supply nozzle 30, in the process of movement, keep a state in which the water supply nozzle 20 is always located radially outwardly of the upper gas supply nozzle 30, or with the distance from the rotary center (substrate center) to the water supply nozzle is always longer than the distance to the upper gas supply nozzle. When the contact angle (FIG. 2) of hydrophobic tendency portion of the substrate (typically low-k film portion) or the substrate size increases, water break tends to occur due to centrifugal force in the peripheral part even if the rotating speed of the substrate W is lowered. If the rotating speed is further lowered to avoid the above tendency, water in the central part becomes harder to move. Therefore, the water supply nozzle 20 is provided outwardly of the upper gas supply nozzle 30 to positively supply water while moving the water supply nozzle 20 from the center to the periphery of the substrate W ahead of the upper gas supply nozzle 30, so as to continuously maintain the water film on the substrate periphery during drying process and prevent a water break. In particular, when the substrate W size is 200 mm or greater, watermarks due to water break on the periphery cannot be prevented only by adjusting the rotating speed and by controlling the flow rate of gas supplied. Therefore, it is important to move the water supply nozzle 20 ahead of the upper gas supply nozzle 30 and supply water simultaneously with the gas supply. Incidentally, while the method described here is to move the water supply nozzle from the center to the periphery of the substrate, it may also be adapted to obtain the same effect by providing a plurality of both water supply nozzles 20 and upper gas supply nozzles 30 at appropriate intervals over the substrate W from its center to periphery and supplying water and gas sequentially from the nozzles in the center. Further alternatively, it may be adapted to keep on supplying water through all the plurality of nozzles and stop supplying water sequentially from the nozzle located in the center.

Here, the nozzle moving speed of the embodiment in FIG. 4A is described. As described above, the water supply nozzle 20 and the upper gas supply nozzle 30 are adapted such that the former is always located outwardly of the latter in the process of movement. In this embodiment, however, the moving speed of the water supply nozzle 20 is set slower than the moving speed of the upper gas supply nozzle 30 so that both the nozzles reach the substrate W periphery approximately simultaneously. With the above constitution, the upper gas supply nozzle 30 does not keep supplying gas for an extended period of time after the water supply nozzle 20 moves beyond the substrate W or water is not supplied to the substrate W any more, so that water break is easily avoided.

As shown in FIG. 4B, also in the integrated type, the water supply nozzle 20 is located on the radially outer side of the upper gas supply nozzle 30. As the water supply nozzle 20 and the upper gas supply nozzle 30 are secured to the same swing arm, they move along the radial direction of the substrate W in an arcuate locus indicated with arrow M while maintaining their relative positions. Therefore, when the water supply nozzle 20 and the upper gas supply nozzle 30 move toward the periphery of the substrate W, the water supply nozzle 20 is located ahead in the advancing direction of the upper gas supply nozzle 30 while keeping a constant distance to the upper gas supply nozzle 30. Because the water supply nozzle 20 should be in a position not affected with the gas supplied through the upper gas supply nozzle 30, the distance between the water supply nozzle 20 and the upper gas supply nozzle 30 is preferably 10 to 30 mm, and in this embodiment 20 mm.

Here in the embodiment shown in FIG. 4B, the angle between a line segment interconnecting the gas supply nozzle 30 and the water supply nozzle 20 and its moving direction is about 90 degrees. Therefore, the gas supply nozzle 30 located in the substrate W center and the water supply nozzle 20 located apart from the center as described above at the time of starting the movement, are located, at the time the movement is over, at approximately the same distance from the center. In this way, moving speeds of both the nozzles are made different by making the direction of movement different from the direction of the line segment. This is, as in the case of FIG. 4A, to avoid the gas supply nozzle 30 keep supplying gas for an extended period of time after the water supply nozzle 20 moves beyond the substrate W or water is not supplied to the substrate W anymore, so that water break is easily avoided. The angle between the direction of movement of both the nozzles and the direction of the line segment connecting them is preferably such that that both the nozzles reach the substrate W periphery simultaneously. This angle α may be 80 to 110 degrees, preferably 85 to 100 degrees, more preferably 90 to 95 degrees, depending on the length of the line segment.

It is also possible to provide a plurality of swing arms each having the water supply nozzle 20 and the upper gas supply nozzle 30, to move the arms simultaneously from the center to periphery of the substrate W along respective arcuate loci to carry out drying. Making the plurality of arcuate loci extend from the center to periphery of the substrate W generally radially at equal angular intervals makes it possible to dry the substrate W evenly. Incidentally, the water supply nozzle 20 and the upper gas supply nozzle 30 may be moved linearly from the center to periphery of the substrate W instead of moving them along the arcuate loci.

Referring to FIG. 1 again, description of the substrate processing apparatus 1 is continued.

The bottom surface multi-hole rinsing nozzle 34 comprises a main part 35 longer than the diameter of the substrate W with a plurality of ejection holes 36 bored at about equal intervals, and is disposed below the substrate W, held generally horizontally with the substrate holding part 10, to pass a point vertically below the center of the substrate W. Water is supplied or ejected through the bottom surface multi-hole rinsing nozzle 34 generally evenly in the direction of a straight line passing the substrate W center (diameter of the substrate W) to the bottom surface of the substrate W. The water supplied through the bottom surface multi-hole rinsing nozzle 34 is the same as that supplied through the water supply nozzle 20, and may be pure water, de-ionized water, carbon dioxide solution water, etc. The water supplied through the bottom surface multi-hole rinsing nozzle 34, like the water supplied through the water supply nozzle 20, may be appropriately chosen out of pure water, de-ionized water, carbon dioxide solution water, alcohol such as IPA, organic solvent, etc., depending on various conditions such as: the type of substrate W, wiring pattern constitution on the substrate W, water ejection angle, atmosphere (temperature, pressure, cleanliness degree, etc.) the substrate processing apparatus 1 is placed in. The above choices are typically controlled with the control part 48. The water supplied through the bottom surface multi-hole rinsing nozzle 34, like the water supplied through the water supply nozzle 20, may be heated.

The lower gas supply nozzle 40 is located below the substrate W held with the substrate holding part 10 and is of the same constitution as that of the upper gas supply nozzle 30. Therefore, the lower gas supply nozzle 40 is capable of ejecting drying gas flow that is thin enough in area in comparison with the surface of the substrate W. It is adapted to remove water on the bottom surface of the substrate W and dry the bottom surface of the substrate W with the drying gas ejected through the lower gas supply nozzle 40. While the number of the gas flow blown through the lower gas supply nozzle 40 is typically one, it may be plural. The gas ejected through the lower gas supply nozzle 40 is the same as the gas ejected through the upper gas supply nozzle 30. Nitrogen, inert gas, or air with contaminants removed may be used. The relative humidity of such gas may be appropriately adjusted by heating, or gas containing vapor of substance that, when dissolved in water, lowers its surface tension, such as vapor of alcohol such as IPA or organic solvent, may be used. The gas ejected through the lower gas supply nozzle 40 may be appropriately chosen in consideration of various conditions such as: the type of substrate W, wiring constitution formed on the substrate W, and atmosphere (temperature, pressure, cleanliness degree, etc.) the substrate processing apparatus 1 is placed in. The above choices are typically controlled with the control part 48.

The lower gas supply nozzle 40 is attached to the fore-end of a swing arm 41. A swing shaft 42 of the swing arm 41 is connected to a drive source 43. The swing arm 41, the swing shaft 42, and the drive source 43 constitute a moving mechanism. The swing arm 41 is swung with the drive source 43 via and about the swing shaft 42. Along with the swing of the swing arm 41, the lower gas supply nozzle 40 moves along an arcuate locus in the radial direction of the substrate W. It is also possible to provide a plurality of swing arms 41 each having a lower gas supply nozzle 40 to move them simultaneously along a plurality of arcuate loci from the center to periphery of the substrate W to carry out drying. Making the plurality of arcuate loci extend from the center to periphery of the substrate W generally radially at equal angular intervals makes it possible to dry the substrate W evenly. Incidentally, the lower gas supply nozzle 40 may be moved linearly from the center to periphery of the substrate W instead of moving it along the arcuate locus. Incidentally, while the method described here is to move the lower gas supply nozzle 40 from the center to the periphery of the substrate, it may also be adapted to obtain the same effect as that by the movement of the lower gas supply nozzle 40 by providing a plurality of lower gas supply nozzles 40 at appropriate intervals from the center of the substrate W to its periphery and supplying gas flow sequentially from the nozzle in the center.

A nozzle that is similar to the water supply nozzle 20 may be used in place of the bottom surface multi-hole rinsing nozzle 34. However, as the bottom surface of the substrate W is even in wetting property because no wiring or the like is formed on it, a constitution is allowed which, as a multi-hole rinsing nozzle, wets the entire bottom surface and simultaneously stops supplying water.

The periphery suctioning part 44 is placed in the vicinity of the periphery of the substrate W to suction water adhering to the periphery of the substrate W. The periphery suctioning part 44 is provided with a periphery suctioning nozzle having a suctioning port for suctioning water. The suctioning port is connected to a suctioning pipe (not shown). The suctioning pipe is connected through a gas-liquid separator (not shown) to a vacuum source (not shown) to suction water with vacuum. As the vacuum source, an ejector or a vacuum pump is used. The periphery suctioning nozzle has a conductive part 45 made of conductive material. The conductive part 45 is placed at the fore-end of the periphery suctioning nozzle and grounded through a lead 46. The distance from the periphery suctioning nozzle to the top surface or the periphery of the substrate W is preferably 1 mm or less, more preferably 0.5 mm or less. The periphery suctioning nozzle is preferably placed in the vicinity of any one of the top surface, side end, and the bottom surface of the substrate periphery. The periphery suctioning nozzle may also be placed in two or more of such positions.

The control part 48 chooses actions of various components constituting the substrate processing apparatus 1 and chooses water and gas supplied to the substrate W. The control part 48 is electrically connected to: the substrate holding part 10, the water supply nozzle 20, the upper gas supply nozzle 30, the bottom surface multi-hole rinsing nozzle 34, the lower gas supply nozzle 40, the holding part suctioning part 14, and the periphery suctioning part 44, respectively, to appropriately control: the rotating speed and pressing force of the roller 11, ejection flow speed (flow rate) of water and gas flow and start and stop of ejection, movement and start and stop positions of respective nozzles, and start and stop of suctioning water on the periphery of the substrate W. The control part 48 implements the above control according to a pre-installed program. Thus the control system for controlling the substrate processing apparatus 1 is constituted.

Also in reference to FIG. 1, the action of the substrate processing apparatus 1 is described.

The substrate W with its surface formed with Damascene wiring and entirely covered with water in the previous process is transferred into the substrate processing apparatus 1 for cleaning. In case water placed to cover the substrate W in the previous process spills from the substrate W, water may be supplied to the substrate W from at least one of the water supply nozzle 20 and the top surface fixed rinsing nozzle 28. Here, the water for covering the substrate W is typically pure water. However, it may be organic solvent, alcohol, or mixture of alcohol and pure water. In this case, it is acceptable as long as it is possible to form a liquid film at a low flow rate before the substrate W is dried and to prevent watermarks from being produced due to liquid break on the substrate W surface. The substrate W is held generally horizontally with appropriate pressing forces by means of the clamp parts 12 of the rollers 11 of the four substrate holding parts 10. The substrate W held generally horizontally may be rotated at a rotating speed of 1000 rpm or less as the roller 11 turns about its axis. In particular it is preferable to make the rotating speed of the substrate W 30 to 800 rpm. Further, making the substrate W rotating speed 300 to 500 rpm is more preferable because it is applicable to the integrated type of moving mechanism. Increasing the rotating speed causes water droplets to collide with the cup part surrounding the centrifugal mechanism and to scatter back, which becomes the cause of producing watermarks on the substrate W surface. Therefore, it is preferable to set an upper limit of about 800 rpm. The reason for setting the upper limit of rotating speed mentioned above is that water break is easy to occur and watermarks are easy to appear at high rotating speed near the periphery, where centrifugal force is great, of the substrate W of a diameter of 200 mm or greater. Incidentally, in consideration of the above-mentioned rotating speed range and the bottom surface drying described later, the roller 11 as hardware is preferably capable of making substrate W rotating speed of 30 to 1000 rpm.

On the other hand, at 30 rpm or less, centrifugal force is short and so water film in the substrate W center cannot be removed by the help of drying gas only. Therefore, it is preferable to keep rotating speed at 30 rpm or higher irrespective of the substrate size. Along with rotating the substrate W, water is supplied through the top surface fixed rinsing nozzle 28 and the bottom surface multi-hole rinsing nozzle 34 to the substrate W to cover both the entire top and bottom surfaces of the substrate W with water. Covering the entire surface of the substrate W with pure water makes it possible to prevent watermarks from appearing due to localized drying of water on the substrate W.

After covering the entire top and bottom surfaces of the substrate W with water, the upper gas supply nozzle 30 and the lower gas supply nozzle 40 are moved so that their fore-ends come to positions at 3 to 10 mm vertically above and below the approximate center of the substrate W, and the water supply nozzle 20 is moved to a position radially outwardly of the upper gas supply nozzle 30 by 10 to 30 mm (FIG. 4). After moving respective nozzles to predetermined positions, simultaneously with or immediately before stopping water supply through the top surface fixed rinsing nozzle 28 and the bottom surface multi-hole rinsing nozzle 34, water is supplied through the water supply nozzle 20 to the substrate W top surface simultaneously with starting supply to the substrate W 300 kPa $N_2$ gas as drying gas through the upper gas supply nozzle 30 and the lower gas supply nozzle 40. The flow rate of water supplied is preferably 50 to 300 milliliters per minute. In this state, the substrate W rotating speed is made about 60 rpm. When the gas flow rate reaches a predetermined value (described later), the upper gas supply nozzle 30 and the lower gas supply nozzle 40 are moved toward the substrate W periphery. Along with this, also the water supply nozzle 20, while keeping its position outwardly of the upper gas supply nozzle 30 in the radial direction of the substrate W, is moved toward the substrate W periphery.

The purpose of keeping on supplying water through the water supply nozzle 20 is to prevent watermarks from appearing due to water break on the substrate W surface. From such a viewpoint, the water supply flow rate is enough as long as it can form water film on the substrate W surface. More than enough flow rate could cause liquid scatter. Liquid scattered flies to the already dried substrate W surface and cause watermarks. Therefore, the water supply flow rate through the water supply nozzle 20 to the substrate W is preferably made necessary and sufficient to form water film on the substrate W surface. In particular with a relatively large substrate W of 300 mm or greater in diameter, because centrifugal force is great, if the flow rate of water supplied to the substrate W is great, liquid scatter becomes a remarkable problem. On the other hand, as the water flow ejected through the water supply nozzle 20 moves toward the substrate W periphery, the area on which water film is to be formed decreases, and water flow rate required to form water film decreases. Therefore, it is preferred to reduce the flow rate of water supplied to the substrate W when the water supply nozzle 20 reaches a point about half the radius of the substrate W.

Alternatively it is preferred to gradually reduce the water flow rate as the water supply nozzle 20 moves from the center toward the periphery. The area S of water film formed on the substrate W along with the movement of the water supply nozzle 20 is: $S=\pi(R^2-r^2)$, where r is the distance of the water supply nozzle 20 from the substrate W center, and R is the substrate W radius, because the area of $\pi r^2$ is already dried with the drying gas supplied through the upper gas supply nozzle 30. Therefore, the flow rate Q(r) of water (ultrapure water) supplied through the water supply nozzle 20 at the distance r may be continuously reduced along with the movement of the water supply nozzle 20 as expressed with an equation $Q=G(1-(r^2/R^2))$, where G is the flow rate of water (ultrapure water) supplied to the central part of the substrate W. Or, $Q \leqq G(1-r^2/R^2)$ is also acceptable. In this way, continuously reducing the flow rate of water (ultrapure water) according to the change in area of the substrate W to be covered with water makes it possible to eliminate the cause of liquid scatter, prevent watermarks from appearing, and further reduce the amount of water used.

The water film on the substrate W surface is easier to form when the rotating speed of the substrate W is higher, and when the water flow ejected through the water supply nozzle 20 is on the periphery, rather than in the center, due to greater centrifugal force. To put it in reverse, if the rotating speed of the substrate W when the water flow is in the center is maintained even after the water flow moves to the periphery, the substrate rotating speed becomes too high, and liquid scatter becomes a remarkable problem in particular with a substrate W diameter of 300 mm or more. Therefore, it is preferred to reduce the substrate W rotating speed down to a predetermined value when the water supply nozzle 20 comes to a point about half the substrate W radius. This reduction in the substrate W rotating speed is typically made while continuing the movement of the water supply nozzle 20. The reduction in the substrate W rotating speed is also made with a predetermined acceleration that does not cause liquid scatter while forming water film. Such a substrate W rotating speed control is especially effective when employing the integrated type of moving mechanism of a relatively high substrate W rotating speed. It is also acceptable to gradually reduce the substrate W rotating speed as the water supply nozzle 20 moves from the center toward periphery of the substrate W. It is also possible to implement simultaneous control of the substrate W rotating speed and the flow rate of water supplied to the substrate W, or to implement the control of either one only.

Figure 5A:
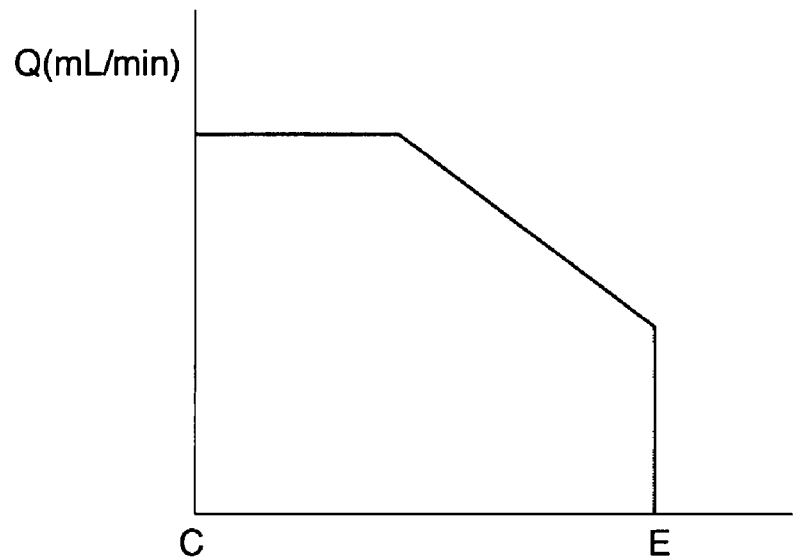
FIG. 5A is a graph showing relationship between water flow rate and water flow position.
Figure 5B:
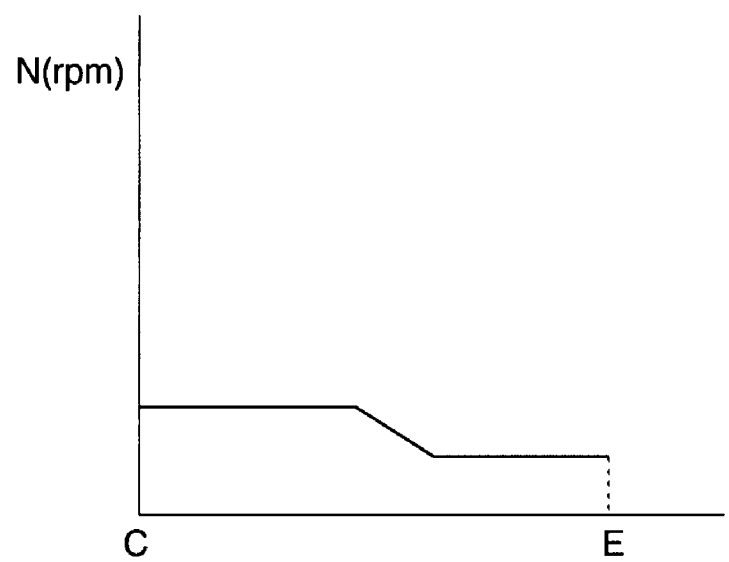
FIG. 5B is a graph showing relationship between substrate rotating speed and water flow position.

FIG. 5A and FIG. 5B show examples of controlling the above-described water flow rate and substrate W rotating speed. FIG. 5A is a graph showing the relationship between the water flow rate and the water flow position. FIG. 5B is a graph showing the relationship between the substrate W rotating speed and the water flow position. In these figures, the vertical axis represents the water flow rate or substrate W rotating speed, the horizontal axis represents the radial position on the substrate W, the character "C" represents the center of the substrate W, and the character "E" represents the end of the substrate W. As shown in FIG. 5A, at first the water flow rate is kept constant while the water flow moves from the center toward the periphery. When the water flow comes to a point about half the radius of the substrate W, the water flow rate gradually decreases. When the water flow reaches the end of the substrate W, the water flow rate becomes zero. As shown in FIG. 5B, at first the substrate W rotating speed is kept constant while if the water flow moves from the center toward periphery of the substrate W. When the water flow comes to a point about half the radius of the substrate W, the substrate W rotating speed is gradually reduced to a predetermined value, and kept there until the water flow reaches the end of the substrate W. Incidentally, the water flow rate or the substrate W rotating speed may be changed in two or more steps or without steps.

Drying gas, if ejected at a high flow rate from the beginning of supply, causes water covering the substrate W to scatter. The scattered water adheres to the dried part of the substrate W, and become the cause of watermarks. Therefore, at first the gas is ejected at a low flow rate, and then at a higher flow rate. The period of time for keeping the low flow rate is about one to two seconds. After the flow rate of the drying gas reaches a high value, the upper gas supply nozzle 30 and the lower gas supply nozzle 40, and the water supply nozzle 20 are moved toward the substrate periphery, to remove water from the substrate W. The low flow rate is 1 to 20 l/min (converted to 1 atm, 0° C.), the high flow rate is not less than 20 l/min (converted to 1 atm, 0° C.). The moving speed of each nozzle at this time is slower at the movement end than at the movement start, typically slowing down as they approach the periphery. This is because the substrate W area from which water is to be removed increases as respective nozzles approach the substrate periphery. Specifically, preferred moving speed is 10 to 40 mm/s near the substrate center, and 2.5 to 6 mm/s near the substrate periphery. Here, the term "near the substrate center" means the area within a circle, concentric with the substrate, of a radius of about 1/10 of the substrate radius. The amount of change in the moving speed of each nozzle may be determined so that the water removal rate per unit time remains approximately equal, or it may be adapted to have linear characteristic. It is preferable that the water supply nozzle 20 and the upper gas supply nozzle 30 are in symmetric positions with respect to the substrate W center, and move radially while keeping a constant radial distance (10 to 50 mm). However, the distance need not necessarily be constant. While water on the substrate is moved from the substrate center toward the periphery with centrifugal force along with the rotation of the substrate W, if this speed is slower than the speed of water break in high hydrophobic property area, liquid droplets are left in high hydrophilic property area near the high hydrophobic property area, and the liquid droplets move to the high hydrophobic property area to cause watermarks there. Therefore, it is preferable to finish the movement of water to the periphery before the water break occurs on the substrate surface by assisting movement of water centrifugal force by moving the upper gas supply nozzle 30 from the substrate center to the periphery while supplying drying gas to the substrate surface.

In case vapor of a substance that, when dissolved in water, lowers its surface tension such as isopropyl alcohol is contained in the drying gas, it is preferable to adapt such that the amount of content is greater when the drying gas flow is on the peripheral side than when it is on the central side of the substrate W.

Figure 6:
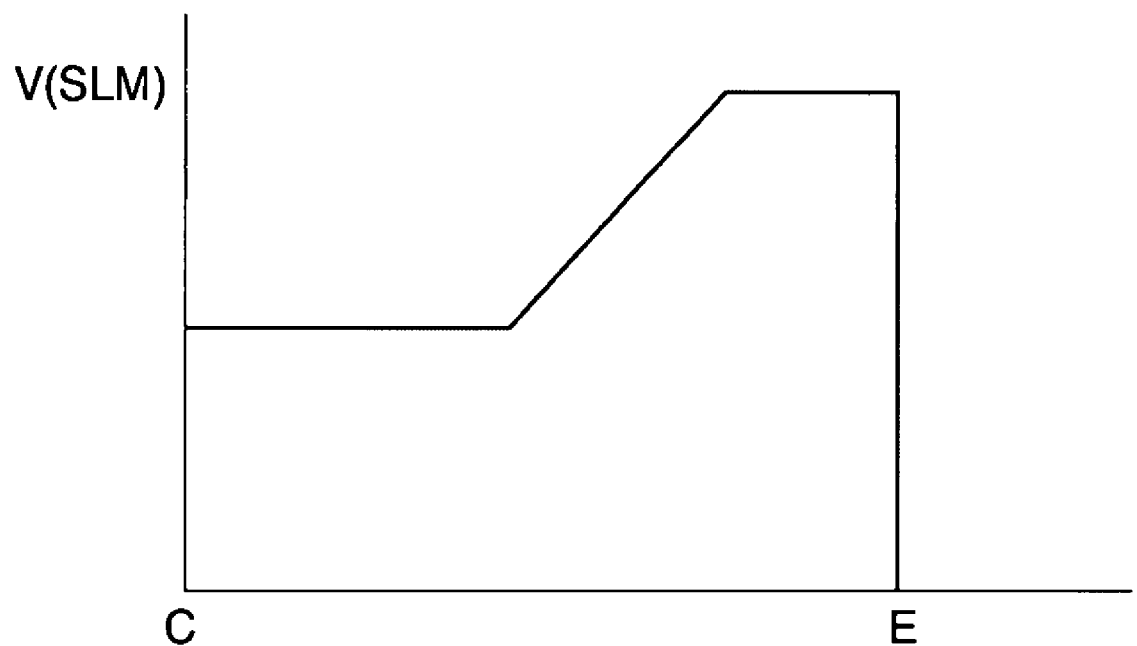
FIG. 6 is a graph showing relationship between the vapor supply rate of the substance that lowers the surface tension and the drying gas flow position.

FIG. 6 is a graph showing relationship between the supply rate of vapor of surface tension lowering substance (hereinafter simply referred to as "vapor" in this paragraph) and the position of the drying gas flow on the substrate W. In the graph, the vertical axis represents the supply amount of vapor V, the horizontal axis represents the radial position on the substrate W, the character "C" represents the substrate center, and the character "E" represents the substrate end. As shown in FIG. 6, at first the supply rate of vapor V remains constant while the drying air flow moves from the center to periphery of the substrate W. When the drying gas flow reaches a point about half the substrate W radius, the vapor supply rate increases gradually to a predetermined value where it remains constant until the drying gas flow reaches the end of the substrate W. The content of vapor of the surface tension lowering substance in the drying gas may be changed in two or more steps or without steps along with the movement of the drying gas flow from central to peripheral side. In case the drying gas contains vapor, a lower flow rate of the ejected drying gas suffices the purpose in comparison with the gas that does not contain vapor.

As described above, in particular with a substrate of not smaller than 300 mm, the area from which water film is to be removed increases toward the periphery of the substrate W. Therefore, it is preferable to slow down the moving speed of each nozzle toward the substrate periphery. However, increasing the content of vapor of the surface tension lowering substance such as isopropyl alcohol, along with the drying gas flow movement toward the periphery, further lowers the surface tension of water. As a result, the force of drawing the gas-liquid boundary in the direction of presence of greater amount of water increases, so that the moving speed of the drying gas flow, even while it moves toward the periphery, may be kept constant. This makes it possible to shorten the time for drying each piece of the substrate W. It is also preferable to start increasing the amount of surface tension lowering substance not from the drying gas flow movement start but from the middle of the movement, thereby cutting down the amount of the surface tension lowering substance used.

After starting supply of drying gas through the upper gas supply nozzle 30 and the lower gas supply nozzle 40 and starting removal of water, a vacuum source (not shown) connected to the holding part suctioning part 14 for the substrate holding part 10 and the periphery suctioning part 44 is operated to also start suction removal of water adhering to the substrate holding part 10 and water on the periphery or the end of the substrate W. Generally, water is more apt to adhere to the substrate periphery than the substrate surface because the processed shape or the like is not perfect there, and water droplets are apt to remain there. Recent trend of obtaining as large a device forming area as possible that is maximally close to the substrate periphery requires the part for example up to 2 mm from the edge to be processed in substantially the same manner as the central part. For this reason, the substrate holding part 10 for rotatably holding the substrate W is provided with the holding part suctioning part 14 for suctioning water to accelerate removal of water from around the substrate end. At the same time, water around the substrate periphery is suctioned with the periphery suctioning part 44. In this way, water is prevented from remaining on the substrate W periphery and drying of the entire substrate W is accelerated. Incidentally, as the holding part suctioning part 14 and the periphery suctioning part 44 are made of conductive material and grounded, the substrate W is not charged with static electricity even if it is generated by friction between water and air when the substrate W rotates. Further, because the cover 17 is provided over the substrate holding part 10, there is no possibility of water, adhering to the substrate holding part 10, flying to the substrate W in the process of or after drying.

When the water supply nozzle 20 moves at a predetermined speed and reaches the substrate periphery, water supply is stopped. Here, it may be adapted such that water supply is continued for an arbitrary period of time after the water supply nozzle 20 reaches the periphery and then the water supply is stopped. However, it is adapted such that the water supply nozzle 20 is stopped before the periphery in consideration of the nozzle diameter so that the nozzle does not overrun the periphery and water is not ejected directly downward. After the stop of water supply, the upper gas supply nozzle 30 and the lower gas supply nozzle 40 reach the substrate periphery approximately simultaneously. Gas supply is continued for about 2 to 5 seconds after the nozzles reaching the periphery, and then stopped. The upper gas supply nozzle 30 and the lower gas supply nozzle 40 stop moving when they reach a position about 3 to 10 mm radially inward (toward the center) from the substrate end, where gas supply is kept for a predetermined period of time and then stopped. If gas is supplied from a position outwardly of the above-mentioned position, there is a risk of contamination with dust or the like by the curl-up of gas ejected through the lower gas supply nozzle 40 on the top surface of the substrate W and by the curl-up of gas ejected through the upper gas supply nozzle 30 on the bottom surface of the substrate W. After the stop of gas supply, the vacuum source connected to the holding part suctioning part 14 for the substrate holding part 10 and the periphery suctioning part 44 is also stopped. Processing one substrate is over as described above, and the processed substrate is transferred to the next process. Incidentally, in case vapor of the substance that, when dissolved in water, lowers its surface tension, is contained in the drying gas, and so a low flow rate of drying gas suffices its purpose, the stop position of the upper gas supply nozzle 30 may be set to be radially inward (toward center) from the substrate end by about 1 to 3 mm. Even in this way, no drying gas curl-up and resultant dust contamination occurs as long as the flow rate of the drying gas flow is low.

Further, in case the bottom surface of the substrate W is formed with a film that is hard to dry, such as a thermal oxidation film, a finish drying at a rotating speed of not faster than 1000 rpm may be applied to the bottom surface after drying the top surface of the substrate. At the time of finish drying, almost no liquid droplets remain on the substrate W and so no problem occurs with liquid droplets scattering back from the cup or the like. Applying this finish drying is particularly preferred when using spin chuck type of the substrate holding part. The reason is that, with the spin chuck type, as the rotary drive shaft is placed in the approximate center of the substrate W, the drying gas ejection nozzle for the substrate bottom surface is hard to place. However, even with the spin chuck type, in case a hollow motor is used for example, the drying gas ejection nozzle may be placed on the bottom surface side of the substrate W. Therefore, the substrate W bottom surface may be dried by supplying drying gas.

Figure 7:
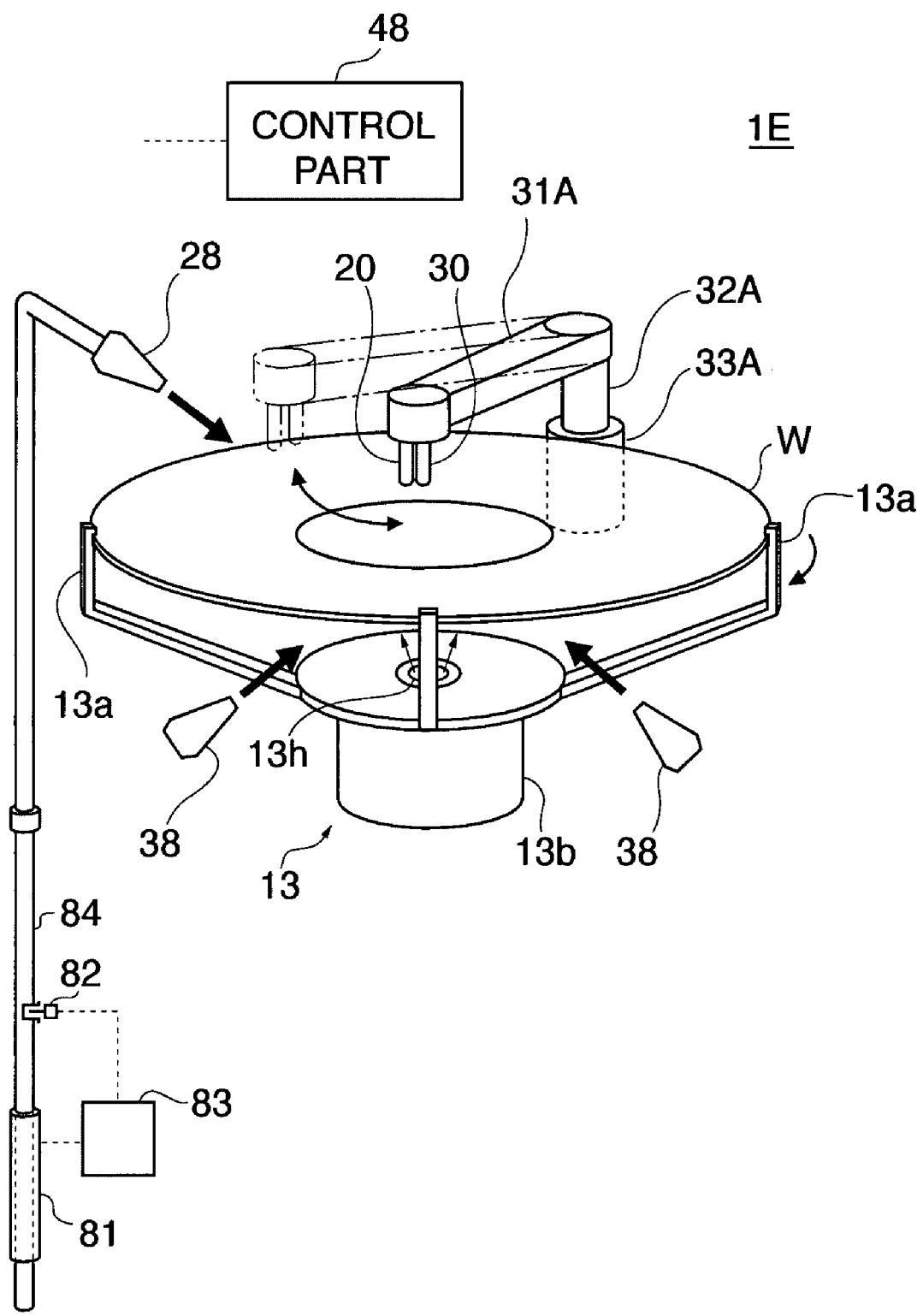
FIG. 7 is a schematic perspective view for explaining a substrate processing apparatus as a modified embodiment of the present invention.

In reference to FIG. 7, the spin chuck type of substrate processing apparatus will be described. FIG. 7 is a drawing for explaining a substrate processing apparatus 1E as a modified example of the embodiment of the invention. In the substrate processing apparatus 1E, a rotary chuck mechanism 13 for holding and rotating the substrate W is provided in place of the roller 10 in the substrate processing apparatus 1 (FIG. 1). The rotary chuck mechanism 13 has a plurality of chuck claws 13a for holding the substrate W, and a rotary drive shaft 13b for rotating in a horizontal plane the substrate W held with the chuck claws 13a. The rotary chuck mechanism 13 as hardware is capable of rotating the substrate W at not greater than about 2000 rpm. The substrate processing apparatus 1E is provided with a bottom surface fixed rinsing nozzle 38 for supplying rinsing water to the substrate W bottom surface. Incidentally, the substrate processing apparatus 1E, due to its structural limitation, is not provided with the bottom surface multi-hole rinsing nozzle 34 and the lower gas supply nozzle 40 (FIG. 1) provided in the substrate processing apparatus 1. The moving mechanism of the substrate processing apparatus 1E shown in FIG. 7 is an example of the integrated type in which the water supply nozzle 20 and the upper gas supply nozzle 30 are placed in a common moving mechanism. The moving mechanism in the substrate processing apparatus 1E has a swing arm 31A, a swing shaft 32A, and a drive source 33A, which respectively correspond to the swing arm 31, the swing shaft 32, and the drive source 33 in the substrate processing apparatus 1. The steps of movement of the water supply nozzle 20 and the upper gas supply nozzle 30, the flow rates, timing, kinds, etc. of water and drying gas supplied to the substrate W are the same as those in the substrate processing apparatus 1. Incidentally, a lower gas supply port 13h for supplying gas to the substrate W may be provided in part of the chuck mechanism 13 facing the approximate center of the substrate W. The gas supplied through the lower gas supply port 13h is typically a gas of a room temperature or about 40° C. In case the lower gas supply port 13h is provided, it is preferably located at a position higher than its surroundings to prevent collection of water. Although not shown, the substrate processing apparatus 1E may be provided with the periphery suctioning part 44 provided in the substrate processing apparatus 1.

The water supplied from the top surface fixed rinsing nozzle 28 to the substrate W, in the same manners in may be heated by providing a heater 81 around part of a pipe 84 connected to the top surface fixed rinsing nozzle 28 the substrate processing apparatus 1. Also the water supplied from the top surface fixed rinsing nozzle 28 may be adjusted to a predetermined temperature (not lower than the room temperature and not higher than the boiling point of water, for example not lower than 25° C. and not higher than 65° C., preferably not lower than 30° C. and not higher than 60° C.) by attaching a temperature sensor 82 for detecting the water temperature to the pipe 84 on the downstream side of the heater 81 and by providing a controller 83 for receiving temperature signal from the temperature sensor 82 for controlling the output of the heater 81. The controller 83 may be constituted as part of the control part 48. Although not shown in from the drawing, the water supplied through the water supply nozzle 20 and the water supplied through the bottom surface fixed rinsing nozzle 38 may also be heated and adjusted to predetermined temperatures in the same manner. The heating of water may be made by passing water through a heater as a device or a heat exchanger in place of the heater wound around the pipe. While it is preferable to heat all the three streams of water supplied through the water supply nozzle 20, the top surface fixed rinsing nozzle 28, and the bottom surface fixed rinsing nozzle 38, it is also acceptable to heat at least one water stream. Also, from the viewpoint of shortening the time for spin-drying the substrate W bottom surface as will be described later, only the water supplied through the bottom surface fixed rinsing nozzle 38 may be heated.

Figure 8A:
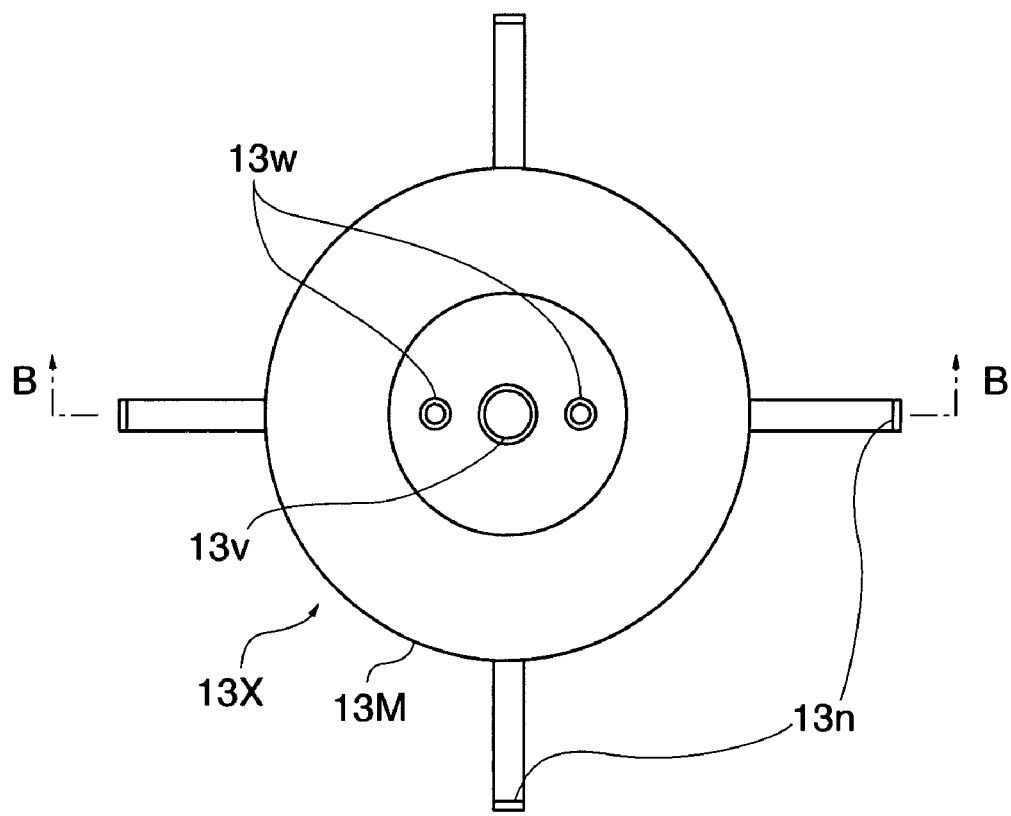
FIG. 8A is a detailed partial plan view of a modified example of the rotary chuck mechanism of the substrate processing apparatus as a modified embodiment of the present invention.
Figure 8B:
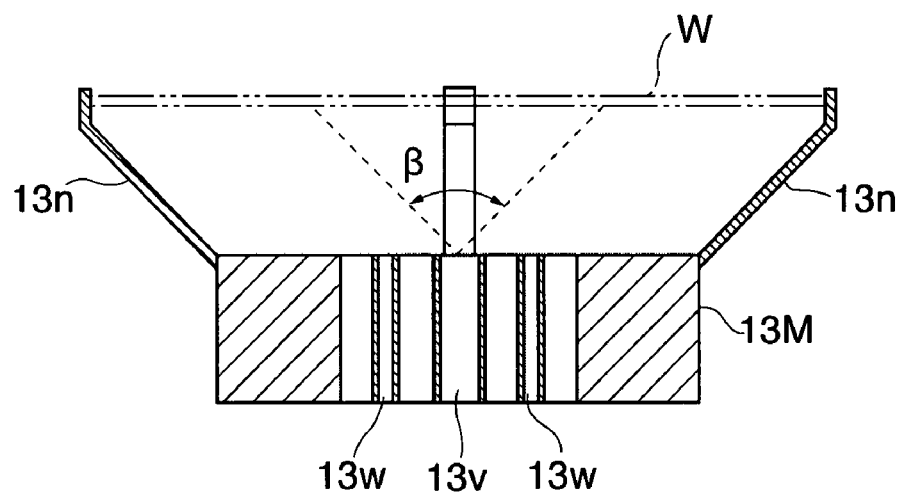
FIG. 8B is a sectional view of a section B-B in FIG. 8A.

Alternatively the substrate processing apparatus 1E may be provided with a rotary chuck mechanism 13X as shown in FIG. 8A and FIG. 8B in place of the rotary chuck mechanism 13 (shown in FIG. 7). FIG. 8A and FIG. 8B show partial detailed views of a modified example of the rotary chuck mechanism of the substrate processing apparatus 1E, with FIG. 8A being a plan view and FIG. 8B being a view of section B-B in FIG. 8A. The rotary chuck mechanism 13X as the modified embodiment has a hollow motor 13M, to the outside round surface of which are attached a plurality of chuck claws 13n. The hollow motor 13M rotates the substrate W held with the chucks 13n in a horizontal plane. In the hollow motor 13M, a bottom surface gas supply nozzle 13v for ejecting gas to the bottom surface of the substrate W is placed vertically below the approximate center of the substrate W. The gas supplied through the bottom surface gas supply nozzle 13v is typically ejected in a conical shape with its apex on the nozzle 13v side and with its base surface assumed to be on the bottom surface of the substrate W. The apex angle β (ejection angle β) of the axial section of the cone of ejected gas is preferably 60 to 120 degrees. The reason is that too small the ejection angle β results in small drying area on the bottom surface of the substrate W covered by the ejected gas, while too great the ejection angle β results in poor drying effect by the ejected gas on the bottom surface of the substrate W. The ejection angle β is determined by an outward divergent conical shape formed at the ejection opening of the bottom surface gas supply nozzle 13v. In the hollow motor 13M, a bottom surface liquid nozzle 13w is provided as a lower rinsing water supply nozzle to eject water to the bottom surface of the substrate W. The bottom surface liquid nozzle 13w may be provided in the hollow motor 13M in place of or together with the bottom surface fixed rinsing nozzle 38 (FIG. 7).

With the substrate processing apparatus 1E, the substrate W is rotated at not less than 200 rpm, and water film is formed on the substrate W top surface by supplying water through the top surface fixed rinsing nozzle 28, followed by drying gas supply through the upper gas supply nozzle 30 while supplying water through the water supply nozzle 20 to the substrate W top surface. The movement of the water supply nozzle 20 and the upper gas supply nozzle 30, the control of the water supply rate to the substrate W surface, the control of the substrate W rotating speed, and the control of the content of the surface tension lowering substance in the drying gas in the substrate W top surface drying process are the same as those with the substrate processing apparatus 1. It is also possible, as in the substrate processing apparatus 1 (FIG. 1), to implement any one of or a combination of any one of: the rotating speed control in which the substrate W rotating speed is made lower when the moving water supply nozzle 20 is on the peripheral side than when it is on the central side of the substrate W, the control in which the content of the substance that when dissolved in water lowers its surface tension is made higher when the drying gas flow is on the peripheral side of the substrate W than when it is on the central side, and the nozzle moving speed control in which the moving speed of the water supply nozzle 20 and the upper gas supply nozzle 30 is made slower when the movement is to be stopped than when the movement is started.

Next, details of example actions of the substrate processing apparatus 1E provided with the rotary chuck mechanism 13X shown in FIG. 8 will be described assuming that the gas supplied through the upper gas supply nozzle 30 is $N_2$ gas containing IPA vapor, and the diameter of the substrate W to be processed is 300 mm. The substrate W transferred from the previous process to the substrate processing apparatus 1E is held with the chuck claws 13n generally horizontally with the surface on which Damascene wiring is applied facing upward. Then the swing arm 31A moves so that the upper gas supply nozzle 30 comes above approximate center of the substrate W. Next, the substrate W is rotated at about 300 rpm by the operation of the hollow motor 13M, and water is supplied through the top surface fixed rinsing nozzle 28 to the substrate W top surface, and through the bottom surface liquid nozzle 13w to the substrate W bottom surface. After supplying water for about 2 seconds through the top surface fixed rinsing nozzle 28 to the substrate W top surface, water supply through the top surface fixed rinsing nozzle 28 is stopped. At the same time, the water supply through the water supply nozzle 20 and the gas supply through the upper gas supply nozzle 30 are started. At this time, water supply through the bottom surface liquid nozzle 13w is continued. The water supply nozzle 20 and the upper gas supply nozzle 30 are moved from the substrate W center toward the periphery, to dry the substrate W top surface. At this time, the moving speed of the swing arm 31A is slowed down as it moves toward the substrate W periphery.

When the water supply nozzle 20 and the upper gas supply nozzle 30 start moving and the upper gas supply nozzle 30 reaches a point away from the substrate W center by a predetermined distance, for example about 75 mm, water supply through the bottom surface liquid nozzle 13w is stopped. Immediately after that, gas ($N_2$ gas) supply through the bottom surface gas supply nozzle 13v to the substrate W bottom surface is started and continued thereafter. The gas ejected through the bottom surface gas supply nozzle 13v diverges in a conical shape, with its part corresponding to the base surface of the cone contacting the substrate W bottom surface, and dries the central part of the substrate W bottom surface. In this way, starting drying the substrate W bottom surface while the substrate W top surface is being dried makes it possible to shorten the time for drying the bottom surface, which will be described later. Further, drying the substrate W center area, where centrifugal force is weak in spin drying, prior to bottom surface drying process makes it possible to shorten the time taken for the bottom surface drying process. This will improve throughput. When the water supply nozzle 20 reaches a point about half the substrate W radius (for example about 75 mm), the substrate W rotating speed is slowed down to about 150 rpm at an acceleration of $(20\pi/3)$ rad/$s^2$ (200 rpm/s) or less.

After that, when water is supplied through the water supply nozzle 20 to the substrate W top surface and the boundary on the substrate edge side of water flow falling on the substrate W reaches the peripheral end, water supply through the water supply nozzle 20 is stopped while continuing the movement of the swing arm 31A. Here, "peripheral end" of the substrate W means part of the substrate W outside a circle that is concentric with and smaller in radius by about 3 mm, preferably about 1 mm, than the substrate W. Next, when gas is supplied through the upper gas supply nozzle 30 to the substrate W top surface and the boundary on the substrate edge side of the gas flow falling on the substrate W reaches the peripheral end, gas supply is stopped while continuing the movement of the swing arm 31A. Then, the substrate W rotating speed is gradually increased at an acceleration of $(20\pi/3)$ rad/$s^2$ (200 rpm/s) or less. When the substrate W rotating speed is not less than 500 rpm, the gas supply through the upper gas supply nozzle 30 is stopped.

With this embodiment, as the gas supplied through the upper gas supply nozzle 30 contains IPA vapor, a low flow rate of the ejected gas flow suffices its purpose, no gas curl-up occurs even if the upper gas supply nozzle 30 is moved up to the peripheral end of the substrate W, and no contamination with dust or the like occurs. Moreover, as the water supply nozzle 20 and the upper gas supply nozzle 30 are moved to the peripheral end of the substrate W, it is possible to dry the substrate W top surface without producing watermarks up to the peripheral end of the substrate W. Further, in case both hydrophilic and hydrophobic patches are present on the substrate W top surface, the Marangoni convection effect is lost if the gas supply through the upper gas supply nozzle 30 is stopped, and so the water remaining on the hydrophilic surface may return to the inside of the substrate W and may cause watermarks. However, as the gas supply through the upper gas supply nozzle 30 is stopped when the substrate W rotating speed is not lower than 500 rpm, water remaining on the periphery and side face is prevented from entering inside with centrifugal force and watermarks are prevented from appearing. Incidentally, the drying process for the substrate W bottom surface is already going on when the movement of the swing arm 31A is stopped and the substrate W rotating speed is gradually increased. So the substrate processing apparatus 1E dries the substrate W bottom surface following the drying of the substrate W top surface.

The process of drying the substrate W bottom surface is described below. To dry the substrate W bottom surface after drying the substrate W top surface, it is preferred to do it in two or more stages of rotating speed, first rotating the substrate W at a relatively low rotating speed (typically about 500 rpm) followed by a relatively high rotating speed (typically about 1000 rpm). The reason is as follows. If the substrate W rotating speed is increased at a stretch when drying the substrate W bottom surface after drying the substrate W top surface, water droplets, if they remain on the side face or the bottom surface of the substrate W, could strike the cup and wall surface, scatter, adhere to the substrate W surface that has been already dried in the above step, and become the cause of produced on the substrate W watermarks. When changing the substrate W rotating speed in two or more stages, it is preferable to do so at an acceleration of $(20\pi/3)$ rad/$s^2$ (200 rpm/s) or less. Also it is preferred to increase the substrate W rotating speed gradually at an acceleration of $(20\pi/3)$ rad/$s^2$ or less so that liquid droplets do not scatter back to the substrate. Incidentally, to shorten the drying time for the substrate W bottom surface, the drying may be made while rotating the substrate W and supplying gas through the lower gas supply port 13h and the bottom surface gas supply nozzle 13v to the substrate W bottom surface.

Figure 9:
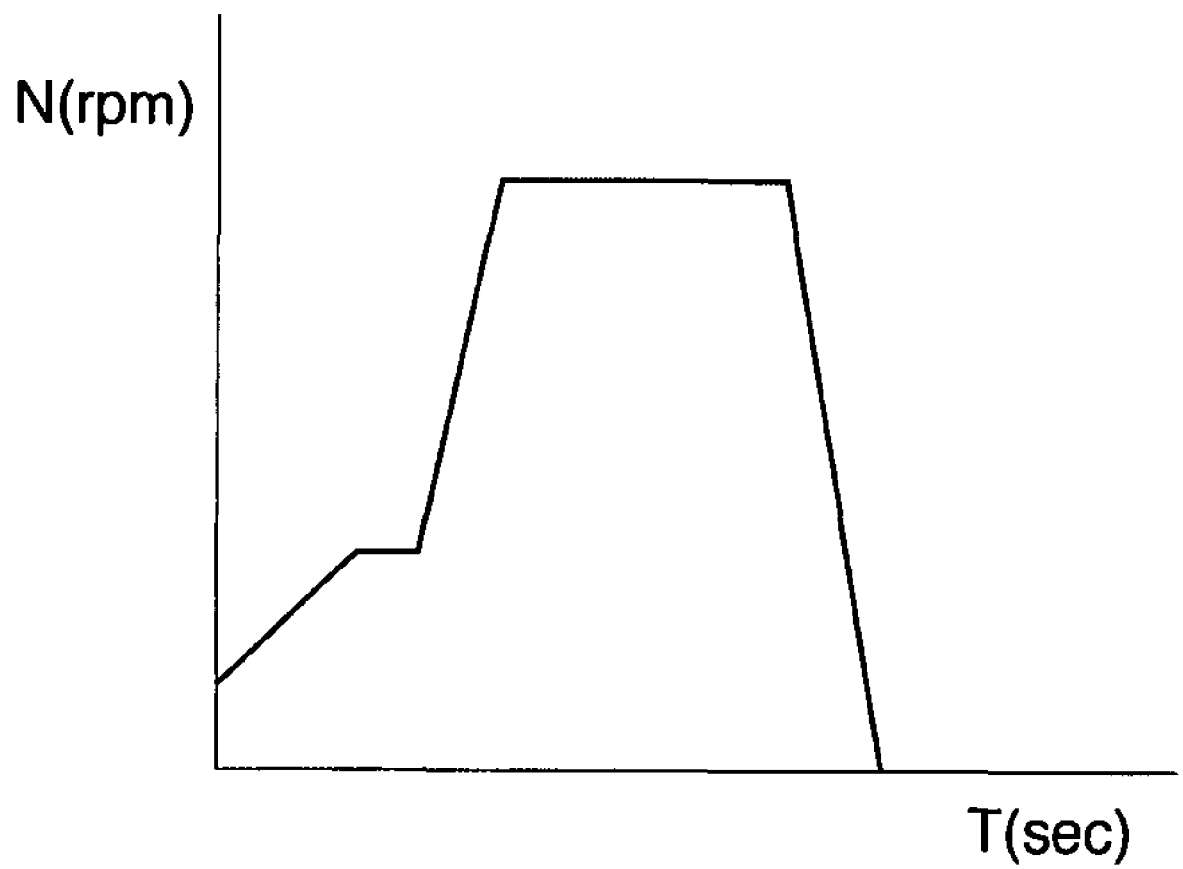
FIG. 9 is a graph showing relationship between substrate rotating speed and elapsed time when drying the substrate bottom surface.

FIG. 9 shows an example of control of the substrate W rotating speed when drying the substrate W bottom surface after drying the substrate W top surface. FIG. 9 shows the relationship between the substrate W rotating speed and the elapsed time. The vertical axis of the graph represents the substrate W rotating speed, and the horizontal axis represents the elapsed time, with the origin representing the time point of starting drying the substrate W bottom surface after finishing drying the substrate W top surface. At the start of drying the bottom surface, the substrate W rotating speed is gradually increased. When the rotating speed reaches a predetermined value, the rotating speed is maintained for a while. After a lapse of a predetermined time, the substrate W rotating speed is increased at a predetermined acceleration or less. When the rotating speed reaches a predetermined value, the rotating speed is maintained and the substrate W is dried. While FIG. 9 shows an example in which the substrate rotating speed is changed in two stages, changing in more than two stages as mentioned above is also acceptable.

A low-k film on a substrate W of a diameter of 300 mm was polished, cleaned, and the top surface was dried while rotating the substrate W at a rotating speed of 200 rpm, then the bottom surface was spin-dried under three conditions enumerated below, and results of detected foreign matter are shown below. Here, the foreign matter means particles of 0.2 micrometers or greater in diameter on the substrate W after bottom surface drying process, detected with a laser defect detector manufactured by KLA Tencole Inc., Model SP-1/TBI. The above-mentioned three conditions are as follows:

(1) The substrate W was rotated at 500 rpm for one second, which was increased up to 1000 rpm at an acceleration of 100 rpm/s ($(10\pi/3)$ rad/s$^2$), at 1000 rpm the substrate W was rotated for 45 seconds and then stopped at an acceleration of 100 rpm/s ($(10\pi/3)$ rad/s$^2$).

(2) The substrate W was rotated at 1000 rpm for one second, which was increased up to 1400 rpm at an acceleration of 250 rpm/s ($(25\pi/3)$ rad/s$^2$), at 1400 rpm the substrate W was rotated for 22 seconds and then stopped at an acceleration of 500 rpm/s ($(50\pi/3)$ rad/s$^2$).

(3) The substrate W was rotated at 500 rpm for one second, which was increased up to 1400 rpm at an acceleration of 100 rpm/s ($(10\pi/3)$ rad/s$^2$), at 1400 rpm the substrate W was rotated for 22 seconds and then stopped at an acceleration of 500 rpm/s ($(50\pi/3)$ rad/s$^2$).

As a result of evaluating two samples for each of the above conditions, the numbers of foreign matter detected were: 27 and 22 for (1), 52 and 47 for (2), and 36 and 36 for (3). As is clear from the results, of the above three conditions, (1) is thought to result in the lowest rate of occurrence of watermarks.

The actions of the substrate processing apparatus 1 or 1E are implemented according to a program installed in the control part 48. The control part 48 is typically made up of elements including computers such as personal computers and microcomputers. The substrate processing apparatus 1 or 1E is typically installed in the atmosphere. The term atmosphere mentioned here does not mean an environment vacuumed or replaced with inert gas where conventional substrate processing is carried out but typically an interior of a clean room of a predetermined cleanliness degree in which the substrate processing apparatus 1 or 1E is placed. Generally, pressure in a clean room is made slightly higher than outside to prevent dust from finding its way from outside. So the interior is slightly positive in pressure relative to the atmosphere. Such an environment is to be included in the concept of "atmosphere." Incidentally, the "atmosphere" is, for example, the environment in a clean room of the vertical laminar flow type as specified in the class 100, preferably 10 or less, of the Federal Standard 209 D.

Next will be described a polishing apparatus provided with the substrate processing apparatus 1 or substrate processing apparatus 1E as an embodiment of the present invention, and an electroless plating apparatus provided with the substrate processing apparatus 1 or substrate processing apparatus 1E.

Figure 10:
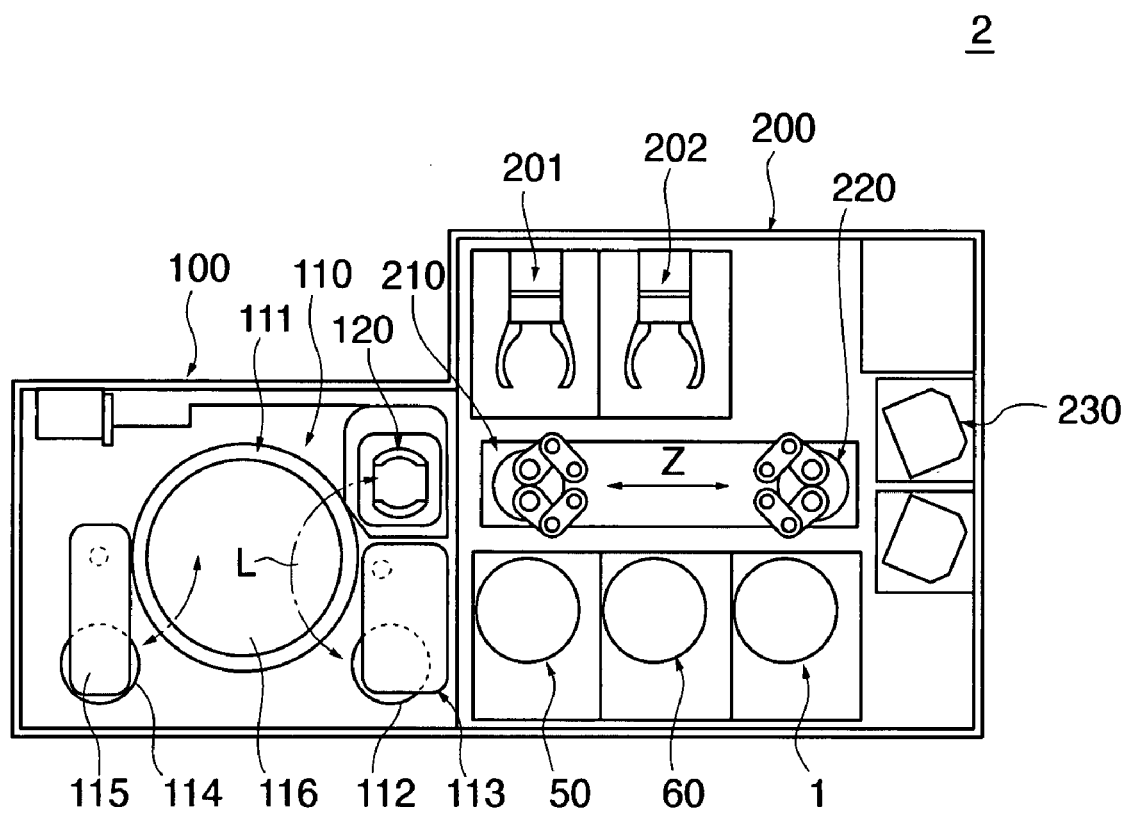
FIG. 10 is a schematic plan view of a polishing apparatus provided with the substrate processing apparatus.

FIG. 10 is a schematic plan view of a polishing apparatus provided with the substrate processing apparatus 1 or 1E. The polishing apparatus 2 is made up of a polishing part 100 and a cleaning part 200. The polishing part 100 is provided with a polishing unit 110 and a work transfer device 120 for transferring the substrate W. The polishing unit 110 is made up of: a turntable 111 placed in the center, a polishing device 113 with a top ring 112 attached that is disposed on one side of the turntable 111, and dressing unit 115 with a dressing tool 114 attached that is disposed on the other side of the turntable 111. The cleaning part 200 is made up of: two transfer robots 210 and 220 placed in the center so as to be movable in the arrow Z directions, a roll scrub cleaning unit 50, a pencil scrub cleaning unit 60, and the substrate processing unit 1 or 1E of the embodiment of the present invention placed side by side in a row on one side of the transfer robots 210 and 220, and two work reversing devices 201 and 202 for reversing the substrate W on the other side of the transfer robots 210 and 220.

Figure 11:
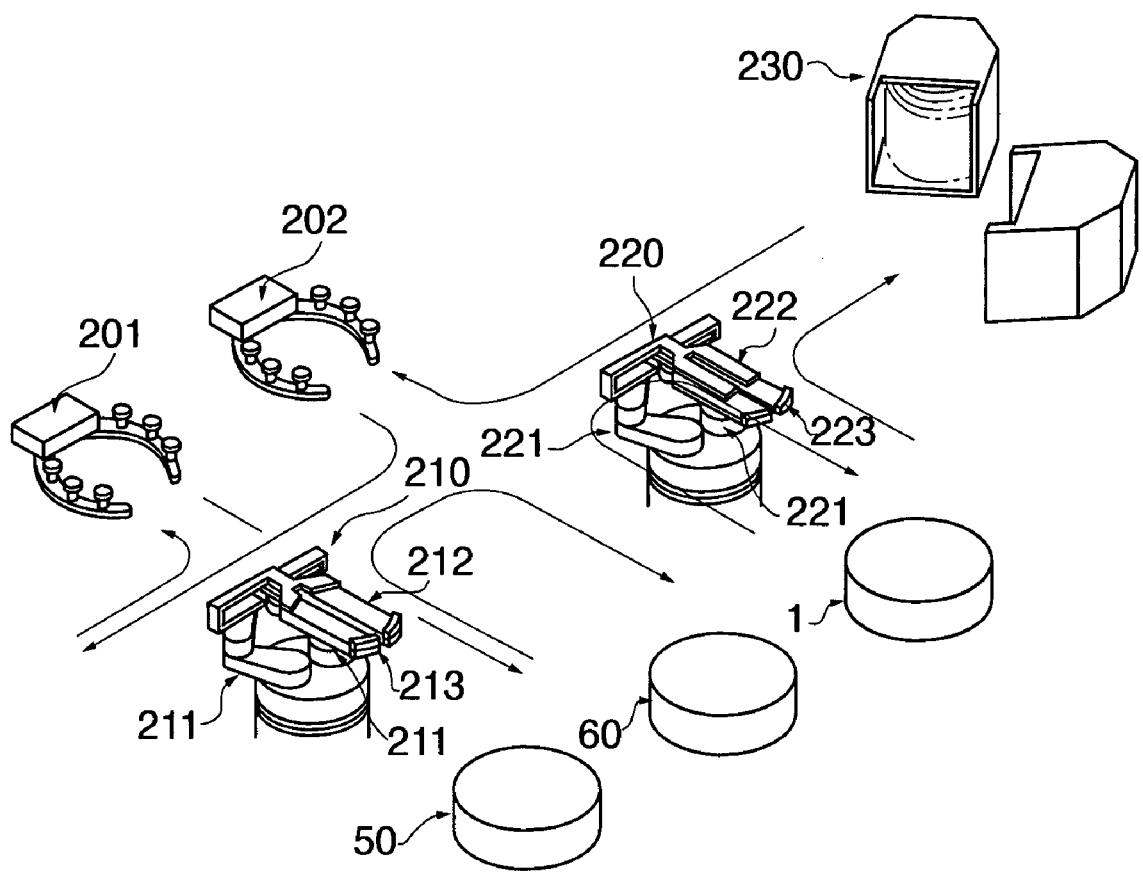
FIG. 11 is a detailed internal perspective view of an essential part of the cleaning part of the polishing apparatus.

FIG. 11 is a detailed perspective view of an essential part of the cleaning part 200. As shown, the transfer robot 210 has two arm mechanisms 211, and the transfer robot 220 has two arm mechanisms 221. Fore-ends of the arm mechanisms 211 are respectively provided with hands 212 and 213, and the fore-ends of the arm mechanisms 221 are respectively provided with hands 222 and 223. The hands 212 and 213 are disposed one over the other, and the hands 222 and 223 are disposed likewise.

Figure 12:
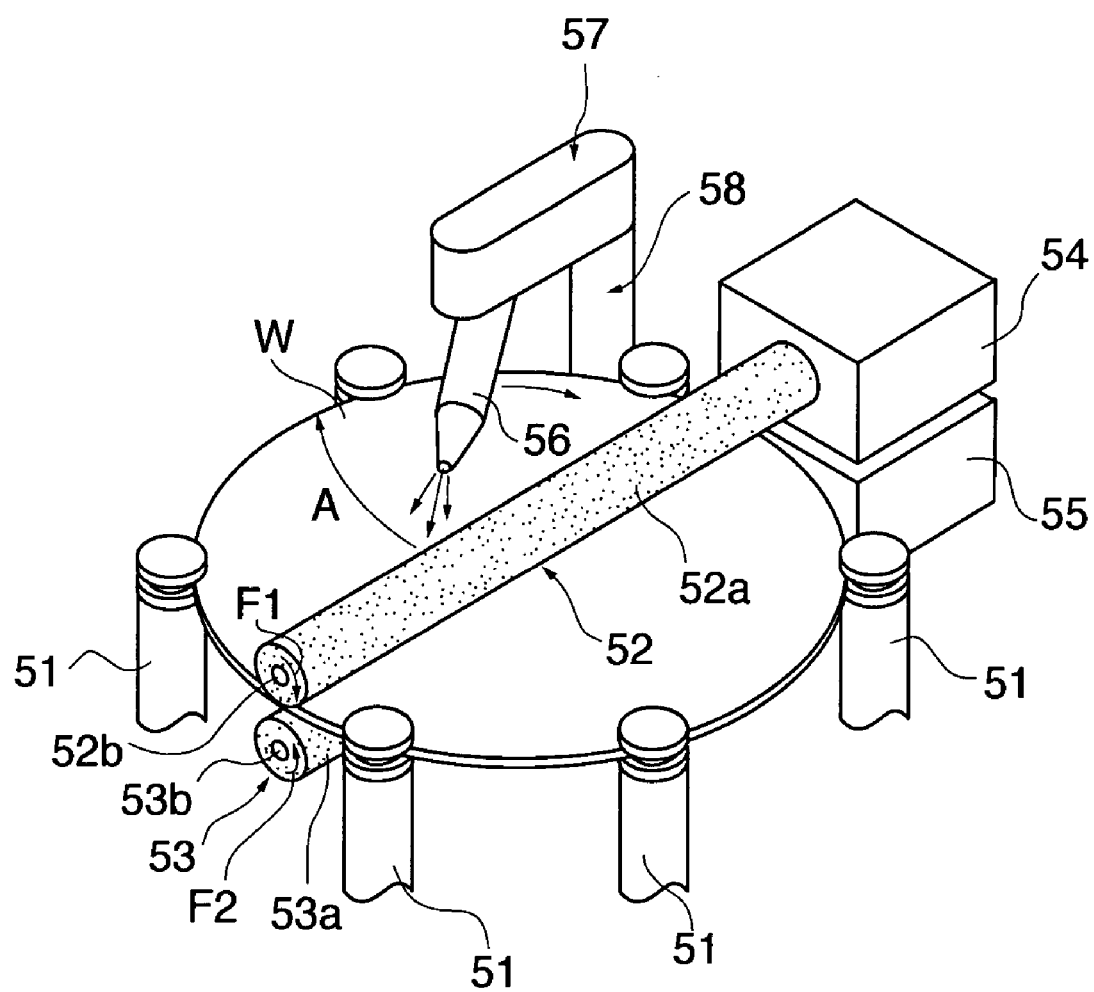
FIG. 12 is a schematic perspective view of a roll scrub cleaning unit.

FIG. 12 is a schematic perspective view of the roll scrub cleaning unit 50. The roll scrub cleaning unit 50 is made up of elements including: a plurality (six in the figure) of rotary spindles (holding members having a rotating mechanism) 51 for rotatably supporting the peripheral edge of the substrate W, two roll type cleaning members 52, 53 disposed over and under the substrate W; drive mechanisms 54, 55 for moving rotary shafts 52*b*, 53*b*, which are parallel to the substrate W surface, toward and away from the substrate W and also for rotating them in the directions of arrows F1, F2, and a cleaning liquid nozzle 56 for supplying cleaning liquid to the substrate W. The roll type cleaning members 52, 53 are constituted with cylindrical members 52*a*, 53*a* as porous PVA sponge, and the shafts 52*b*, 53*b* penetrate therethrough. The average diameter of pores formed in the sponge constituting the cylindrical members 52*a*, 53*a* is most preferably 110 micrometers or less, because the dust (particle) removal ability of the roll type cleaning members 52, 53 is higher as the average diameter is smaller, as known. The cylindrical members 52*a*, 53*a* may be made of expanded polyurethane. The nozzle 56 is attached to a cleaning arm 57 to supply cleaning liquid to the substrate W top surface while being swung with a swing shaft 58 in the direction indicated with the arrow A. Cleaning liquid containing surface active agent is preferred for use.

Figure 13:
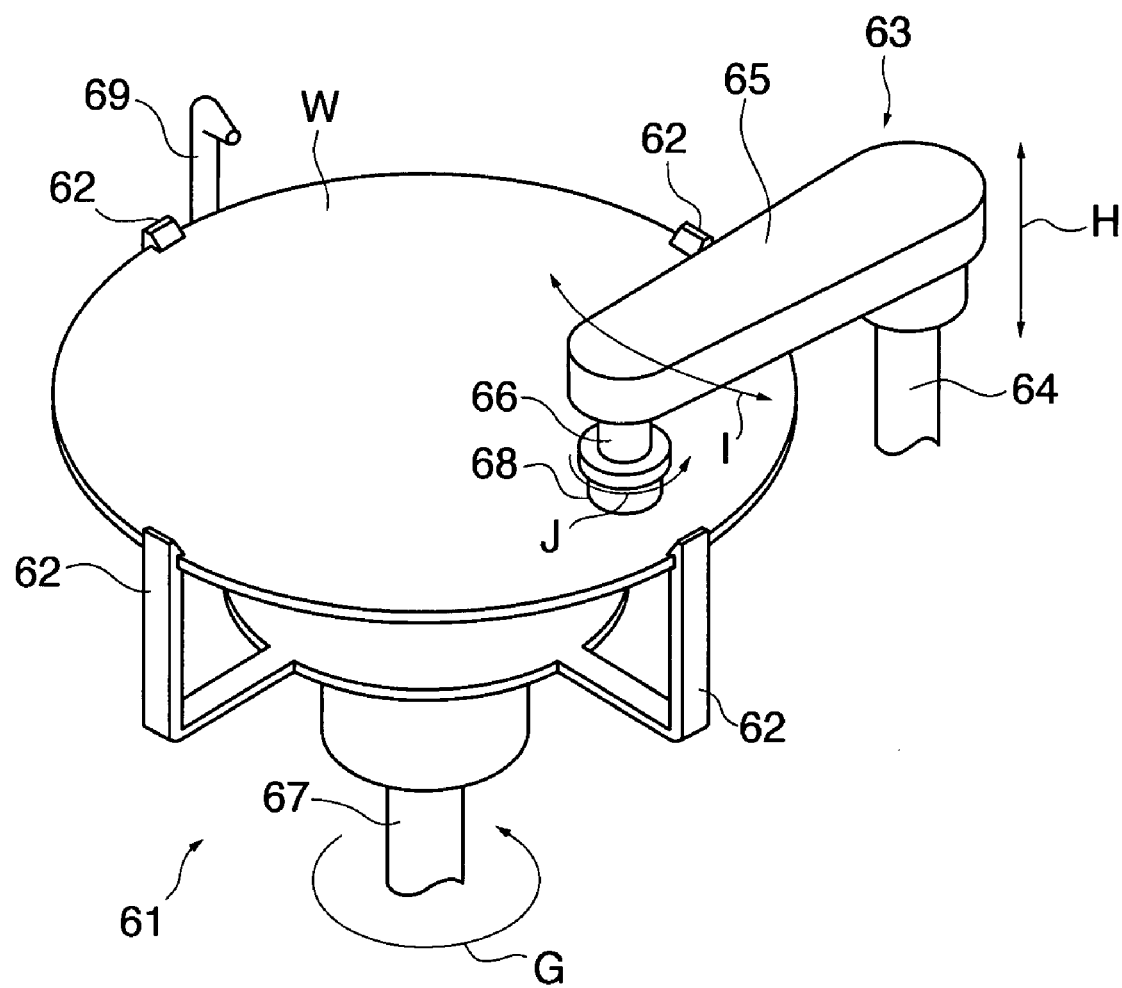
FIG. 13 is a schematic perspective view of a pencil scrub cleaning unit.

FIG. 13 is a schematic perspective view of the pencil scrub cleaning unit 60. The pencil scrub cleaning unit 60 is made up of elements including a rotary chuck mechanism 61 and a pencil type brush cleaning mechanism 63. The rotary chuck mechanism 61 has chuck claws 62 for holding the substrate W periphery, and is rotated with a rotary drive shaft 67 in the direction indicated with the arrow G. The pencil type brush cleaning mechanism 63 has a swing arm 65 with its one end supported with a shaft 64. At the other end of the swing arm 65 is provided a rotary drive shaft 66 projecting vertically down toward the to-be-cleaned surface of the substrate W. A pencil type cleaning member 68 made of porous PVA sponge, expanded polyurethane or the like is attached to the lower end of the rotary drive shaft 66. The pencil type cleaning member 68 is formed in a generally cylindrical shape with a horizontal bottom surface for contacting the substrate W, and has dimensions of for example about 5 mm in height, and about 20 mm in outside diameter. The average diameter of the pores formed in the sponge is about 110 micrometers. Because the effect of the sponge is greater as the average diameter of the pores is smaller, a preferable pore diameter is 80 micrometers or less. The shaft 64 is capable of moving up and down as indicated with the arrow H. Along with the rotation of the shaft 64, the swing arm 65 swings in the direction indicated with the arrow I. Along with the rotation of the rotary drive shaft 66, the pencil type cleaning member 68 rotates in the direction indicated with the arrow J. The pencil scrub cleaning unit 60 is further provided with a cleaning liquid nozzle 69 for supplying cleaning liquid. Cleaning liquid containing surface active agent is preferred for use.

Next will be described actions of the polishing apparatus 2 shown in FIG. 10. A substrate W is taken with the hand 222 (FIG. 11) of the transfer robot 220 one by one out of a cassette 230 containing substrates W to be cleaned, and transferred to the work reversing device 202. The work reversing device 202 reverses the substrate W with the surface to be polished (for example the surface having a circuit pattern formed) facing downward. The substrate W is further transferred from the work reversing device 202 to the hand 212 of the transfer robot 210 and to the work transfer device 120 of the polishing part 100. The substrate W on the work transfer device 120 is, as indicated with the arrow L, held to the underside of the top ring 112 of swingable the polishing device 113, transferred onto the turntable 111, and polished on a rotary polishing surface 116. At this time, polishing liquid is supplied through a polishing liquid supply pipe (not shown) onto the polishing surface 116. The substrate W after being polished is returned again to the work transfer device 120, transferred with the hand 213 of the transfer robot 210 (FIG. 11) to the work reversing device 201, reversed while being rinsed with rinsing liquid, and transferred with the hand 213 to the roll scrub cleaning unit 50.

The rotating roll type cleaning members 52, 53 are brought into contact with the top and bottom surfaces of the substrate W rotating as described above, and cleaning liquid is ejected through the cleaning liquid nozzle 56. Particles adhering to the top and bottom surfaces of the substrate W are removed and flushed together with cleaning liquid (FIG. 12). The substrate W cleaned with the roll scrub cleaning unit 50 is transferred from there with the hand 212 of the transfer robot 210 to the pencil scrub cleaning unit 60. At the pencil scrub cleaning unit 60, the periphery of the substrate W is held with the chucks 62. In this state, the entire rotary chuck mechanism 61 is rotated at a high rotating speed by the drive of the drive shaft 67 to rotate the substrate W at a predetermined rotating speed of 500 to 1500 rpm. The rotating speed by the rotary chuck mechanism 61 when the substrate W is processed may be chosen with a rotating speed controller of a drive motor (not shown) connected to the rotary drive shaft 67 within a permissible rotating speed of around several thousand rpm. The top surface of the substrate W, while rotating, is cleaned as the pencil type cleaning member 68 in rotating state comes into contact with the top surface of the rotating substrate W, cleaning liquid is supplied through the cleaning liquid nozzle 69, and simultaneously the swing arm 65 is swung (FIG. 13). The surface of the substrate W processed as described above typically has a partial area of a contact angle relative to water of 30 to 80 degrees where watermarks are likely to appear. The substrate W cleaned with the pencil scrub cleaning unit 60 is transferred with the hand 223 of the transfer robot 220 to the substrate processing apparatus 1, 1E. As there is a risk of part of the substrate top surface in transfer drying up and producing watermarks, it is preferable to rinse it immediately after pencil cleaning or in transfer so that the transfer is made while the top surface is coated with water. In the substrate processing apparatus 1, 1E, cleaning and drying of the substrate W are made in the manner as described in relation to the actions of the substrate processing apparatus 1, 1E. In this way it is possible to process the substrate W, on which the Damascene wiring is formed, without producing watermarks, although the Damascene wiring is apt to produce watermarks.

Incidentally, with the polishing apparatus 2, it is possible to make cleaning by giving ultrasonic energy from the cleaning liquid nozzle 56 to the substrate W top surface in place of or before cleaning with the roll type cleaning members 52, 53 of the roll scrub cleaning unit 50. Cleaning by ejecting cleaning liquid having ultrasonic energy given removes many particles present on the substrate W. It is also possible to make cleaning by giving ultrasonic energy from the cleaning liquid nozzle 69 to the substrate W top surface in place of or before cleaning with the pencil type cleaning member 68 of the pencil scrub cleaning unit 60. Of the scrub cleaning, the pencil scrub cleaning is particularly superior in foreign matter removal ability to the roll scrub cleaning. Therefore, it is possible to make foreign matter removal efficiently with a single step of pencil scrubbing when the amount of foreign matter is small, while making the cleaning process in two stages when the amount of foreign matter is great, first by roll scrubbing followed by pencil scrubbing. It is also possible to make the pencil scrub cleaning or both the roll scrub cleaning and the pencil scrub cleaning with the same module as the substrate processing apparatus 1, 1E. Making it with the same module makes it possible to reduce installation space of the polishing apparatus 2 and improve efficiency due to reduced travel of the substrate W.

Figure 14:
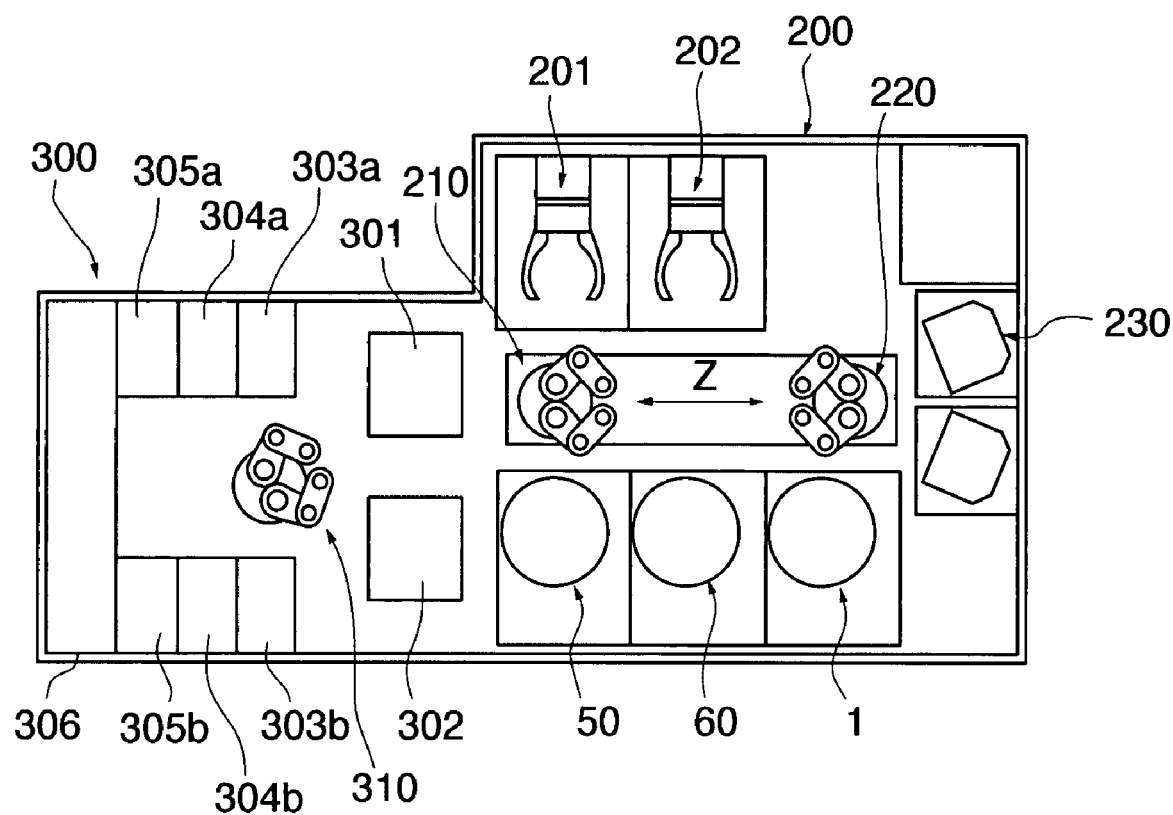
FIG. 14 is a schematic plan view of an electroless plating apparatus provided with the substrate processing apparatus.

FIG. 14 is a schematic plan view of an electroless plating apparatus provided with the substrate processing apparatus 1, 1E. The electroless plating apparatus 3 is of a similar constitution to that of the polishing apparatus 2 except that the polishing part 100 of the polishing apparatus 2 shown in FIG. 10 is replaced with a plating part 300. That is, the cleaning part 200 of the electroless plating apparatus 3 is the same in constitution as that of the polishing apparatus 2. In the plating part 300 are disposed in parallel rows: a pre-cleaning module 301 for cleaning the substrate before plating, a reversing device 302 for reversing the substrate, first pre-processing units 303a, 303b for dosing catalyst to the substrate surface, second pre-processing units 304a, 304b for applying agent process to the catalyst-dosed substrate surface, and electroless plating units 305a, 305b for applying electroless plating to the substrate surface. A plating liquid supply unit 306 is provided at an end of the plating part 300. A running type transfer robot 310 is placed in the center of the plating part 300.

Next, actions of the electroless plating apparatus 3 shown in FIG. 14 is described. A substrate W to be plated is transferred to the pre-cleaning module 301 with the transfer robots 220, 210 out of the cassette 230 holding the substrates W to be plated. In the pre-cleaning module 301, residue such as copper remaining on the low-k film is removed. For example, the substrate is held W as facing down and immersed in a solution of acid (agent solution) such as 0.5 M sulfuric acid for one minute. Then, the substrate surface is cleaned with cleaning liquid (water) such as ultrapure water. Then, the substrate W is transferred with the transfer robot 310 to the first pre-processing unit 303a (or 303b) where the substrate W is held as facing downward and catalyst is dosed to the substrate W top surface. This catalyst dosage is made for example by immersing the substrate W for about one minute in a mixed solution (agent solution) of 0.005 g/L of $PdCl_2$ and about 0.2 mol/L of HCl or the like. This makes Pd (palladium) as catalyst adhere to the surface of wiring (Cu) and form Pd nuclei as catalyst seeds on the wiring surface. After that, the substrate W surface is cleaned with water.

Then, the catalyst-dosed substrate W is transferred with the transfer robot 310 to the second pre-processing unit 304a (or 304b) where the substrate W is held as facing downward and agent processing is applied to the substrate W surface. Neutralizing process is applied to the wiring (Cu) surface by immersing the substrate W in a solution (agent solution) of for example $Na_3C_6H_5O_7 \cdot 2H_2O$ (sodium citrate). After that, the substrate W surface is cleaned with water. In this way, the substrate to which the pre-processing for the electroless plating is applied is transferred with the transfer robot 310 to the electroless plating unit 305a (or 305b). In the electroless plating unit 305a, the substrate W is held as facing downward and selective electroless plating (electroless Co—W—P cap plating) is applied to the activated wiring surface of the substrate W by immersing it in a Co—W—P plating solution of 80° C. for about two minutes. Then, the substrate W surface is cleaned with cleaning liquid (water) such as ultrapure water. In this way, a wiring protection layer (cap plating layer) consisting of Co—W—P alloy film is selectively formed on the wiring surface. Then, the substrate W after being applied with the electroless plating is transferred with the transfer robot 310 to the reversing device 302 where the substrate W is reversed so that the surface, having the wiring pattern formed, faces upward.

The substrate W transferred to the reversing device 302 is further transferred with the transfer robot 210 of the cleaning part 200 to the roll scrub cleaning unit 50. Thereafter, as with the actions of the cleaning part 200 in the polishing apparatus 2 shown in FIG. 10, scrub cleaning is made with the roll scrub cleaning unit 50 and the pencil scrub cleaning unit 60, and substrate cleaning is made with the substrate processing apparatus 1, 1E. Because of the risk that the substrate top surface partially dries up during transfer and produce watermarks, it is preferable to rinse it immediately after pencil cleaning or in transfer so that the transfer is made while the substrate is coated top surface with water. In this way, with the electroless plating apparatus 3, the substrate W having the Damascene wiring formed, which is apt to produce watermarks, is processed without producing watermarks.

The substrate W cleaned and processed with the substrate processing apparatus 1, 1E in the above-described polishing apparatus 2 or the electroless plating apparatus 3 is provided with electrodes, inspected, diced, and made into a semiconductor device. In the above embodiment, while the substrate top surface in transfer is covered with pure water, the covering may be made using organic solvent, alcohol, or mixture of alcohol and pure water, in place of pure water. In this case, it is possible to form a thin liquid film at a low flow after the substrate cleaning process and before the substrate drying process, and prevent watermarks from appearing due to water break on the substrate surface.

The invention claimed is:

1. A substrate processing apparatus comprising:
   a substrate holding part configured to hold a substrate generally horizontally and rotate the substrate;
   an upper gas supply nozzle configured and arranged so as to be disposed above the substrate when the substrate is held with the substrate holding part, and configured to supply gas to a top surface of the substrate, the gas containing vapor of a substance that is soluble in water and, when dissolved in water, lowers surface tension of the water;
   a water supply nozzle configured and arranged so as to be disposed above the substrate when the substrate is held with the substrate holding part, and configured to supply water to the substrate, the water supply nozzle being configured and arranged so as to be disposed outwardly of the upper gas supply nozzle in the radial direction of the substrate;
   a moving mechanism configured to move the upper gas supply nozzle and the water supply nozzle from a central side of the substrate toward a peripheral side of the substrate while keeping the water supply nozzle located outwardly of the upper gas supply nozzle in the radial direction of the substrate; and
   a control part configured to control a content, in the gas, of vapor of the substance that, when dissolved in water, lowers the surface tension of the water so that the content of vapor of the substance is higher when the upper gas supply nozzle is on the peripheral side of the substrate than when the upper gas supply nozzle is on the central side of the substrate.

2. The substrate processing apparatus as recited in claim 1, comprising a constant temperature tank configured to store, in liquid state at a predetermined temperature, a substance that is to be added as vapor to the gas, and that, when dissolved in the water, lowers its surface tension.

3. The substrate processing apparatus as recited in claim 1, further comprising a holding part suctioning part configured to suction the water adhering to the substrate holding part.

4. The substrate processing apparatus as recited in claim 1, further comprising a periphery suctioning part configured to suction the water from a periphery of the substrate.

5. The substrate processing apparatus as recited in claim 4, wherein a holding part suctioning part and the periphery suctioning part have a conductive part made of conductive material and the conductive part is grounded.

6. The substrate processing apparatus as recited in claim 1, comprising:
   a lower gas supply nozzle, disposed below the substrate held with the substrate holding part, configured to supply gas to a bottom surface of the substrate;
   wherein the substrate holding part has a roller configured to contact an end of the substrate held, and the roller is rotatable about an axis thereof while keeping contact with the substrate held.

7. The substrate processing apparatus as recited in claim 1, comprising:
   a bottom surface gas supply nozzle, disposed below the substrate held with the substrate holding part, configured to supply gas to a bottom surface of the substrate;
   wherein the substrate holding part has chuck claws configured to hold the substrate.

8. The substrate processing apparatus as recited in claim 7, wherein the bottom surface gas supply nozzle is disposed below the approximate center of the substrate held with the chuck claws and the bottom surface gas supply nozzle is configured to supply gas by ejection in an inverted conical shape with its apex on the lower side.

9. The substrate processing apparatus as recited in claim 1, comprising a cover configured to surround at least part of the substrate holding part so that the water adhering to the substrate holding part does not scatter to the substrate held.

10. The substrate processing apparatus as recited in claim 1, comprising:
    an upper rinsing water supply nozzle configured to supply water to a top surface of the substrate; and
    a lower rinsing water supply nozzle configured to supply water to a bottom surface of the substrate.

11. The substrate processing apparatus as recited in claim 10, wherein at least one of the water supplied through the water supply nozzle, the water supplied through the upper rinsing water supply nozzle, and the water supplied through the lower rinsing water supply nozzle is capable of being heated.

12. The substrate processing apparatus as recited in claim 10, wherein the water supplied through the lower rinsing water supply nozzle is capable of being heated.

13. The substrate processing apparatus as recited in claim 1, wherein the moving mechanism is configured such that, when the moving mechanism moves the upper gas supply nozzle and the water supply nozzle from the substrate central side toward the peripheral side, a moving speed of the upper gas supply nozzle and the water supply nozzle is slower when they are going to stop moving than when they started moving.

14. The substrate processing apparatus as recited in claim 1, wherein the substrate holding part is capable of rotating the substrate at a rotating speed of 30 to 800 rpm.

15. The substrate processing apparatus as recited in claim 1, comprising a control part configured to cause the substrate to rotate at a lower rotating speed when the water supply nozzle is on the substrate peripheral side than when the water supply nozzle is on the substrate central side.

16. The substrate processing apparatus as recited in claim 1, comprising a control part configured to control a rate of water flow supplied through the water supply nozzle to the substrate to be smaller when the water supply nozzle is on the substrate peripheral side is smaller than when the water supply nozzle is on the substrate central side.

17. The substrate processing apparatus as recited in claim 1, comprising a control part configured to bring a rotating speed of the substrate to a first predetermined rotating speed when the upper gas supply nozzle and the water supply nozzle move from the substrate central side toward the peripheral side, stop the water supply through the water supply nozzle when the water supply nozzle reaches the substrate peripheral end, increase the substrate rotating speed while stopping the movement of the upper gas supply nozzle when the upper gas supply nozzle reaches the substrate peripheral end, and stop the gas supply through the upper gas supply nozzle when the substrate rotating speed reaches a second predetermined rotating speed which is higher than the first predetermined rotating speed.

18. The substrate processing apparatus as recited in claim 1, comprising a control part configured to cause a rotating speed of the substrate to change at an acceleration of (20p/3) rad/s2 or less.

19. A polishing apparatus comprising:
the substrate processing apparatus as recited in claim 1;
a polishing unit configured to polish the substrate; and
a cleaning unit configured to apply scrub cleaning or ultrasonic cleaning to the substrate.

20. An electroless plating apparatus comprising:
the substrate processing apparatus as recited in claim 1;
an electroless plating unit configured to apply electroless plating to the substrate; and
a cleaning unit configured to apply scrub cleaning or ultrasonic cleaning to the substrate.

21. A substrate processing apparatus comprising:
a control system configured to control operations in which:
a substrate holding part for holding and rotating a substrate is configured to rotate the substrate in a generally horizontal plane;
first and second rinsing water supply nozzles configured to supply water therethrough, and being disposed above and below the substrate, respectively, so as to be capable of covering a top surface of the substrate with the water;
an upper gas supply nozzle configured to be moved from a vicinity of a center of the substrate toward a periphery of the substrate when supplying gas through the upper gas supply nozzle to the substrate top surface, the gas containing vapor of a substance that is soluble in water and, when dissolved in water, lowers surface tension of the water;
a water supply nozzle configured such that, simultaneously with the upper gas supply nozzle supplying gas to the substrate top surface, the water supply nozzle is moved to a position radially outwardly of the upper gas supply nozzle while when supplying water to the substrate top surface, so as to remove water on the substrate top surface; and
a control part configured to control a content, in the gas, of vapor of the substance that, when dissolved in water, lowers the surface tension of the water so that the content of vapor of the substance is higher when the upper gas supply nozzle is on the peripheral side of the substrate than when the upper gas supply nozzle is on the central side of the substrate.

22. A substrate processing apparatus comprising:
a substrate holding part configured to hold a substrate generally horizontally and rotate the substrate;
an upper gas supply nozzle configured and arranged so as to be disposed above the substrate when the substrate is held with the substrate holding part, and configured to supply gas to a top surface of the substrate, the gas containing vapor of a substance that is soluble in water and, when dissolved in water, lowers surface tension of the water;
a water supply nozzle configured and arranged so to be disposed above the substrate when the substrate is held with the substrate holding part, and configured to supply water to the substrate, the water supply nozzle being configured and arranged so as to be disposed outwardly of the upper gas supply nozzle in the radial direction of the substrate;
a moving mechanism configured to move the upper gas supply nozzle and the water supply nozzle from a central side of the substrate toward a peripheral side of the substrate while keeping the water supply nozzle located outwardly of the upper gas supply nozzle in the radial direction of the substrate; and
a control means for controlling a content, in the gas, of vapor of the substance that, when dissolved in water, lowers the surface tension of the water so that the content of vapor of the substance is higher when the upper gas supply nozzle is on the peripheral side of the substrate than when the upper gas supply nozzle is on the central side of the substrate.

* * * * *